(12) United States Patent
Anzue et al.

(10) Patent No.: US 8,895,419 B2
(45) Date of Patent: Nov. 25, 2014

(54) NITRIDE SEMICONDUCTOR LIGHT-EMITTING ELEMENT AND METHOD FOR FABRICATING THE SAME

(71) Applicant: Panasonic Corporation, Osaka (JP)

(72) Inventors: Naomi Anzue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/069,655

(22) Filed: Nov. 1, 2013

(65) Prior Publication Data

US 2014/0054636 A1 Feb. 27, 2014

Related U.S. Application Data

(63) Continuation of application No. PCT/JP2012/004152, filed on Jun. 27, 2012.

(30) Foreign Application Priority Data

Jul. 6, 2011 (JP) .................................. 2011-149966

(51) Int. Cl.
*H01L 21/22* (2006.01)
*H01L 21/02* (2006.01)

(52) U.S. Cl.
USPC .......................................... 438/549; 257/611

(58) Field of Classification Search
USPC .................. 438/376, 542–549; 257/486, 611, 257/E21.466–E21.469
See application file for complete search history.

(56) References Cited

U.S. PATENT DOCUMENTS

| 6,228,457 | B1 | 5/2001 | Ueno et al. |
| 8,680,553 | B2 * | 3/2014 | Saito et al. ..................... 257/98 |
| 8,698,193 | B2 * | 4/2014 | Arai et al. ..................... 257/103 |
| 2002/0014630 | A1 | 2/2002 | Okazaki et al. |
| 2002/0081800 | A1 | 6/2002 | Morita |
| 2005/0087758 | A1 | 4/2005 | Kwak et al. |
| 2005/0142820 | A1 | 6/2005 | Kim |
| 2011/0037088 | A1 | 2/2011 | Oya et al. |
| 2011/0037089 | A1 | 2/2011 | Oya et al. |

FOREIGN PATENT DOCUMENTS

| JP | 2005-136415 | 5/2005 |
| JP | 2005-307328 | 11/2005 |
| JP | 2007-201046 | 8/2007 |
| JP | 4417166 | 12/2009 |
| JP | 2010-056423 | 3/2010 |
| JP | 4568379 | 8/2010 |
| JP | 4568380 | 8/2010 |

OTHER PUBLICATIONS

International Search Report for International Application No. PCT/JP2012/004152 mailed Jun. 27, 2012.

* cited by examiner

*Primary Examiner* — Calvin Lee
(74) *Attorney, Agent, or Firm* — Renner, Otto, Boisselle & Sklar, LLP

(57) ABSTRACT

This nitride-based semiconductor light-emitting element includes: a nitride-based semiconductor multilayer structure including a p-type semiconductor region, the nitride-based semiconductor multilayer structure having a growing plane which is an m-plane; and an electrode which is arranged on an $Al_dGa_eN$ layer. The $Al_dGa_eN$ layer is formed of a GaN-based semiconductor. The electrode includes Ag as the principal component and also includes Ge and at least one of Mg and Zn.

19 Claims, 12 Drawing Sheets

● N
⊘ Ga

NITRIDE SEMICONDUCTOR LIGHT-EMITTING ELEMENT AND METHOD FOR FABRICATING THE SAME

This is a continuation of International Application No. PCT/JP2012/004152, with an international filing date of Jun. 27, 2012, which claims priority of Japanese Patent Application No. 2011-149966, filed on Jul. 6, 2011, the contents of which are hereby incorporated by reference.

BACKGROUND

1. Technical Field

The present specification relates to a nitride semiconductor light-emitting element and a method for fabricating such an element.

2. Description of the Related Art

A nitride semiconductor including nitrogen (N) as a Group V element is a prime candidate for a material to make a short-wave light-emitting element, because its bandgap is sufficiently wide. Among other things, gallium nitride-based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes formed of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $x+y+z=1$, $x\geq0$, $y\geq0$, and $z\geq0$) semiconductor crystal, some of the Ga atoms shown in FIG. 1 may be replaced with Al and/or In atoms.

FIG. 2 shows four vectors $a_1$, $a_2$, $a_3$ and c, which are generally used to represent planes of a wurtzite crystal structure with four indices (i.e., hexagonal indices). The primitive vector a runs in the [0001] direction, which is called a "c-axis". A plane that intersects with the c-axis at right angles is called either a "c-plane" or a "(0001) plane". It should be noted that the "c-axis" and the "c-plane" are sometimes referred to herein as "C-axis" and "C-plane". Thus, in the accompanying drawings, those axes and planes are identified by the capital letter to make them recognizable more easily.

In fabricating a semiconductor element using GaN-based semiconductors, a c-plane substrate, i.e., a substrate of which the principal surface is a (0001) plane, is generally used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum efficiency decreases. Thus the threshold current is increased in a semiconductor laser diode. In an LED, the power dissipation is increased and the luminous efficiency is decreased. Meanwhile, as the density of injected carriers increases, the piezoelectric field is screened, thus varying the emission wavelength, too.

Thus, to overcome these problems, it has been proposed that a substrate, of which the principal surface is a non-polar plane such as a (10-10) plane, which is perpendicular to the [10-10] direction, be used. Such a (10-10) plane is called an "m-plane". In this description, "-" attached on the left-hand side of a Miller-Bravais index in the parentheses means a "bar" (a negative direction index). As shown in FIG. 2, the m-plane is parallel to the c-axis (i.e., the primitive vector c) and intersects with the c-plane at right angles. On the m-plane, Ga atoms and nitrogen atoms are on the same atomic plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

In this case, the "m-plane" is a generic term that collectively refers to a family of planes including (10-10), (-1010), (1-100), (-1100), (01-10) and (0-110) planes. Also, in present specification, the "X-plane growth" means epitaxial growth that is produced perpendicularly to the X plane (where X=c or m) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

Consequently, an LED that has been fabricated on such a substrate having a non-polar plane, for example, can achieve higher luminous efficiency than a conventional element that has been fabricated on a c-plane.

As can be seen, a GaN-based semiconductor element that has been grown on an m-plane substrate can achieve more significant effects, but has higher contact resistance, than what has been grown on a c-plane substrate. That is a problem.

Japanese Patent Publication No. 4568379 says that a GaN-based semiconductor light-emitting element, of which the principal surface is an m-plane, can have its contact resistance reduced by using a p-side electrode which is formed of an Mg layer that contacts with a p-type semiconductor region and an Ag layer that has been stacked on the Mg layer. Japanese Patent Publication No. 4568380 says that a GaN-based semiconductor light-emitting element, of which the principal surface is an m-plane, can have its contact resistance reduced by using an electrode made up of Zn and Ag. According to the disclosures of these Japanese Patent Publications, by going through a heat treatment, the element Ga diffuses from the p-type semiconductor region toward the p-side electrode and forms Ga vacancies acting as acceptors in the p-type semiconductor region, thus reducing the contact resistance.

On the other hand, Japanese Laid-Open Patent. Publication No. 2005-136415 discloses an electrode of Group III-V compound semiconductors which is characterized by including a first layer to be formed on a layer of a Group III-V nitride semiconductor and formed of a Zn-based material including a solute element in Zn and a second layer to be stacked on the first layer and formed of at least one substance selected from the group consisting of Au, Co, Pd, Pt, Ru, Rh, Ir, Ta, Cr, Mn, Mo, Tc, W, Re, Fe, Sc, Ti, Sn, Ge, Sb, Al, ITO, ZITO, ZIO, GIO, ZTO, FTO, AZO, GZO, $In_4Sn_3O_{12}$ and $Zn_{1-x}Mg_xO$ ($0\leq x\leq 1$).

Furthermore, Japanese Patent Publication No. 4417166 says that an Ag—Pd—Cu—Ge alloy with increased moisture resistance can be provided by replacing In included in an Ag—In—Cu—Ge alloy, which is a conventional decorative silver alloy, with Pd.

Furthermore, Japanese Laid-Open Patent Publication No. 2010-56423 discloses a p-side electrode 120 including an Ag alloy layer 120a, a Ti layer 120b, and an Au layer 120c which have been stacked in this order on a p-GaN contact layer 118. The Ag alloy layer 120a includes Ag as its principal component and Pd, Cu and Ge as additives. Since Ge has been added, interaction between Pb and Cu can be produced and good thermal and chemical stability can be achieved even at relatively low Pd and Cu concentrations. On top of that, by adding Ge to the Ag alloy layer 120a, a decrease in reflectance due to the addition of Pd and Cu can be minimized. The Ag alloy layer 120a is an alloy obtained by adding 1.0 mass % of Pd, 1.0 mass % of Cu, and 0.1 mass % of Ge to Ag.

SUMMARY

The power efficiency and luminous efficiency achieved by these conventional technologies are not fully satisfactory yet but still need to be improved.

One non-limiting, and exemplary embodiment of the present specification provides a nitride semiconductor light-emitting element which can further improve the power efficiency and luminous efficiency and a method for fabricating such an element.

An aspect of the present disclosure provides a nitride semiconductor light-emitting element including: a nitride-based semiconductor multilayer structure including a p-type semiconductor region, of which the growing plane is an m-plane; and an electrode which is arranged on the p-type semiconductor region. The p-type semiconductor region is formed of a GaN-based semiconductor, and the electrode includes Ag as its principal component and also includes Ge and at least one of Mg and Zn.

A nitride semiconductor light-emitting element and method for fabricating the element according to an aspect of the present disclosure contributes to improving the power efficiency and luminous efficiency.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
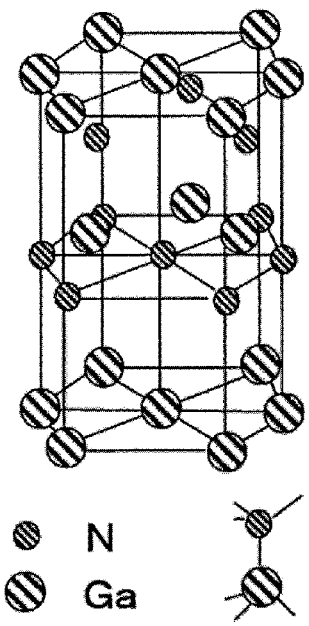
FIG. 1 is a perspective view schematically illustrating a unit cell of GaN.
Figure 2:
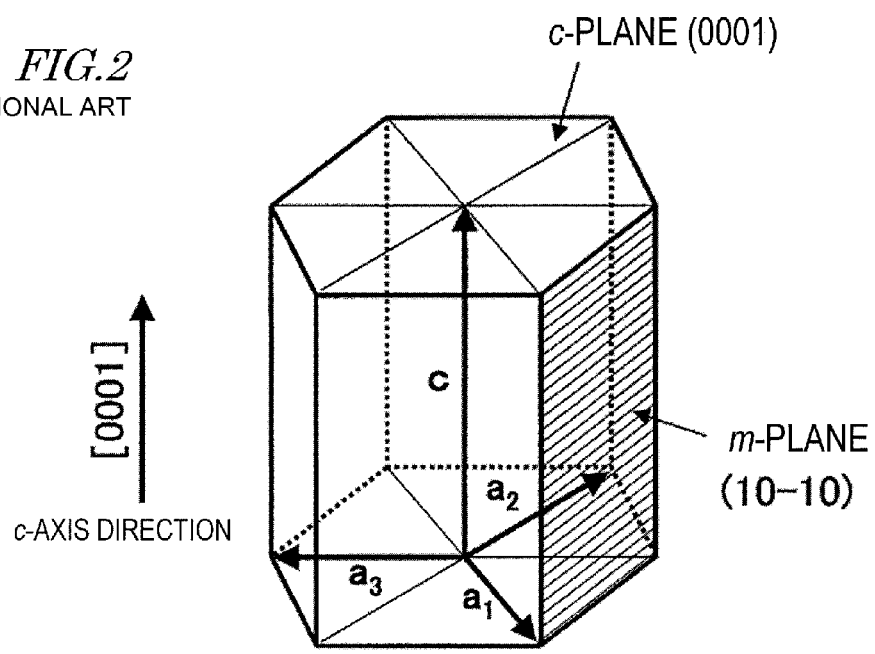
FIG. 2 is a perspective view showing four primitive vectors $a_1$, $a_2$, $a_3$ and c representing a wurtzite crystal structure.

Hereinafter, it will be described from what standpoint the present inventors got the basic idea of our invention.

For example, in an ordinary flip-chip bonded LED, the light emitted from its active layer is partially reflected from a p-side electrode and goes out of a semiconductor layer through the substrate. In that case, in order to extract the emission of the active layer of the LED to an external device as efficiently as possible, it is important to form a p-side electrode layer having high reflectance. Ag may be used as a material having high reflectance to make the p-side electrode layer.

Generally speaking, when an electrode including a metal film is provided for a semiconductor, a heat treatment is carried out in order to remove a Schottky barrier to be produced between the semiconductor and the metal. If the metal film includes Ag, then Ag could cause an aggregation phenomenon during the heat treatment. When such an aggregation phenomenon happens, the surface area of the metal film decreases so as to reduce the excessive free energy on the surface of the metal film (i.e., surface energy). As a result of that aggregation phenomenon, Ag atoms move in the film. Consequently, the film could come to have increased surface roughness or vacancies could be created in the film, thus possibly decreasing optical reflectance.

The present inventors discovered that when an Ag electrode was formed on a GaN-based semiconductor layer that had been grown on an m-plane substrate, such aggregation of Ag occurred more easily than in a situation where an Ag electrode was formed on a GaN-based semiconductor layer that had been grown on a c-plane substrate.

On top of that, since Ag will corrode, the reflectance of such an electrode will decrease easily. More specifically, Ag will react easily with oxygen, sulfur and halogen, and will often cause migration in an environment where there is a lot of water.

The present inventors discovered means for decreasing the contact resistance and increasing the optical reflectance at the same time and improving the power efficiency and luminous efficiency even in such a situation.

An aspect of the present disclosure can be outlined as follows:

(1) A nitride semiconductor light-emitting element according to an aspect of the present disclosure includes: a nitride-based semiconductor multilayer structure including a p-type semiconductor region, of which the growing plane is an m-plane; and an electrode which is arranged on the p-type semiconductor region. The p-type semiconductor region is formed of a GaN-based semiconductor, and the electrode includes Ag as the principal component and also includes Ge and at least one of Mg and Zn.

A nitride semiconductor light-emitting element according to an aspect of the present disclosure can improve the power efficiency and the luminous efficiency.

(2) In (1), the electrode may include Ag at a concentration of 50 mass % or more and may also include Mg, Zn and Ge at a concentration of 50 mass % or less in total.

(3) In (1) or (2), the electrode may include Ag at a concentration of 90 mass % or more and may also include Mg, Zn and Ge at a concentration of 10 mass % or less in total.

(4) In one of (1) to (3), the electrode may include Ge at a concentration of not less than 0.05 mass % and not more than 2.0 mass %.

(5) In one of (1) to (4), at an interface between the electrode and the p-type semiconductor region, either Mg or Zn may have a higher concentration than Ge.

(6) In one of (1) to (5), the concentration of Ge may be lower at an interface between the electrode and the p-type seminconductor region than at the surface of the electrode opposite from the p-type semiconductor region.

(7) In one of (1) to (6), the electrode may include Ga that has diffused from the p-type semiconductor region, and the more distant from the interface with the p-type semiconductor region it is, the lower the concentration of Ga in the electrode may be.

(8) In one of (1) to (7), the electrode may include elements other than Ag, Mg, Zn, Ge and Ga at a concentration of 0.1 mass % or less in total.

(9) In (8), the elements may include at least one element selected from the group consisting of Ni, Cu, Pd, In, Sn, Nd, Sm, Pt, Au and Bi.

(10) In one of (1) to (9), the electrode may have a reflectance of 85% or more with respect to light having a wavelength of 450 nm.

(11) In one of (1) to (10), the electrode may have a reflectance of 90% or more with respect to light having a wavelength of 520 nm.

(12) In one of (1) to (11), the electrode may have a thickness of not less than 2 nm and not more than 500 nm.

(13) In one of (1) to (12), the p-type semiconductor region may be formed of an $Al_xGa_yIn_zN$ (where x+y+z=1, x≥0, y>0 and z≥0) semiconductor.

(14) A light source according to an aspect of the present disclosure includes: the nitride semiconductor light-emitting element of one of (1) to (13); and a wavelength changing portion which includes a phosphor that changes the wavelength of light that has been emitted from the nitride semiconductor light-emitting element.

(15) A method for fabricating a nitride semiconductor light-emitting element according to an aspect of the present disclosure includes the steps of: (a) providing a substrate; (b) forming a nitride-based semiconductor multilayer structure including a p-type semiconductor region, of which a growing plane is an m-plane, on the substrate; and (c) forming an electrode on the growing plane of the p-type semiconductor region. The p-type semiconductor region is formed of a GaN-based semiconductor, and the electrode includes Ag as its principal component and also includes Ge and at least one of Mg and Zn.

(16) In (15), the step (c) may include the steps of depositing at least one of Zn and Mg layers on the growing plane of the p-type semiconductor region and depositing an Ag alloy layer including Ge.

(17) In (15), the step (c) may include the steps of depositing a Ge layer on the growing plane of the p-type semiconductor region and depositing a Zn layer or an Mg layer.

(18) In (15), the step (c) may include the step of depositing an Ag alloy layer including Ge and at least one of Zn and Mg.

(19) In one of (15) to (18), the step (c) may include the step of heating the electrode at a temperature of not less than 400 degrees Celsius and not more than 600 degrees Celsius.

(20) In one of (15) to (19), the step (c) may include forming the electrode so that elements other than Ag, Mg, Zn, Ge and Ga that are included in the electrode have a concentration of 0.1 mass % or less in total.

(21) In one of (15) to (20), after the step of heating the electrode has been performed, the concentration of Ge may be lower at an interface between the electrode and the p-type semiconductor region than the Ge concentration at the surface of the electrode opposite from the p-type semiconductor region.

Hereinafter, exemplary embodiments of the present disclosure will be described with reference to the accompanying drawings. In the following drawings, any pair of components shown in multiple drawings and having substantially the same function will be identified by the same reference numeral for the sake of simplicity. It should be noted that the present inventors is in no way limited to the embodiments to be described below.

Figure 3A:
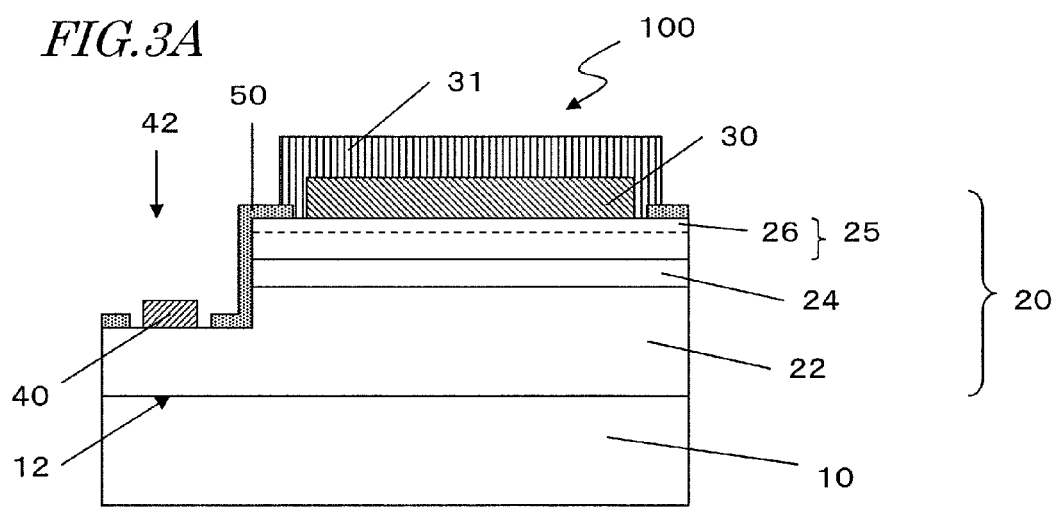
FIGS. 3A to 3C are schematic cross-sectional views illustrating a nitride-based semiconductor light-emitting device 100 as an exemplary embodiment of the present disclosure.
Figure 3B:
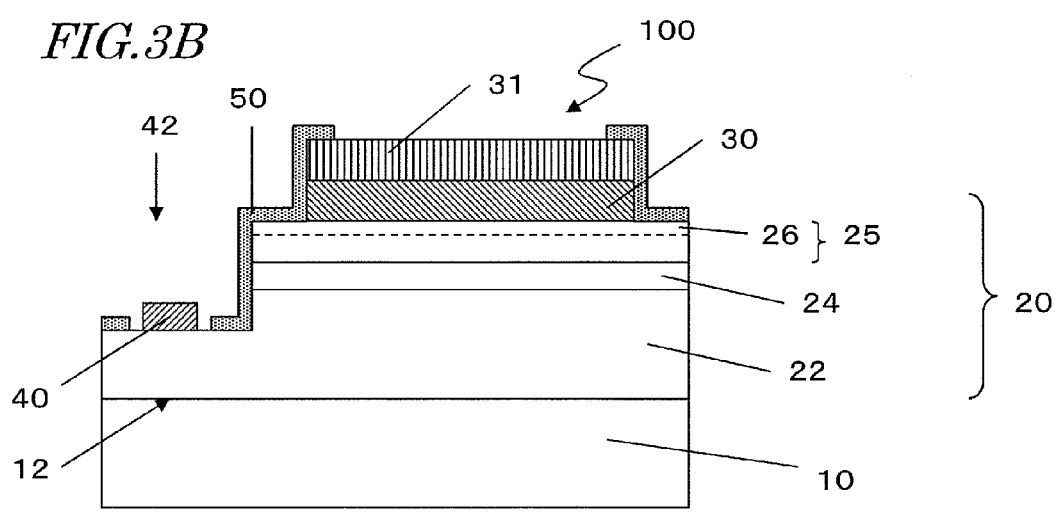
Figure 3C:
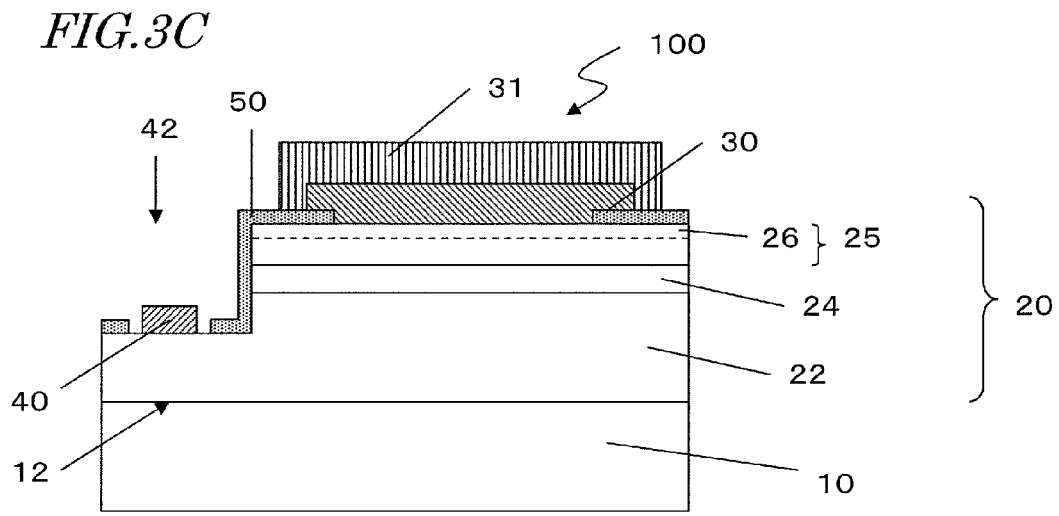

FIGS. 3A to 3C schematically illustrates the cross-sectional structure of a nitride-based semiconductor light-emitting element 100 according to an exemplary embodiment of the present disclosure. The nitride-based semiconductor light-emitting element 100 illustrated in FIGS. 3A to 3C has a nitride-based semiconductor multilayer structure formed of GaN-based semiconductors.

The nitride-based semiconductor light-emitting element 100 of this embodiment includes a GaN-based substrate 10, of which the growing plane (surface) 12 is an m-plane, a semiconductor multilayer structure 20 that has been formed on the m-plane, and an electrode 30 arranged on the semiconductor multilayer structure 20. In this embodiment, the semiconductor multilayer structure 20 is an m-plane semiconductor multilayer structure that has been formed through an m-plane crystal growth and its growing plane is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 having the configuration of this embodiment, at least the growing plane of its semiconductor region that contacts with an electrode needs to be an m-plane.

The nitride-based semiconductor light-emitting element 100 of this embodiment includes the GaN-based substrate 10 to support the semiconductor multilayer structure 20. However, the element 100 may have any other substrate instead of the GaN-based substrate 10 and could also be used without the substrate.

Figure 4A:
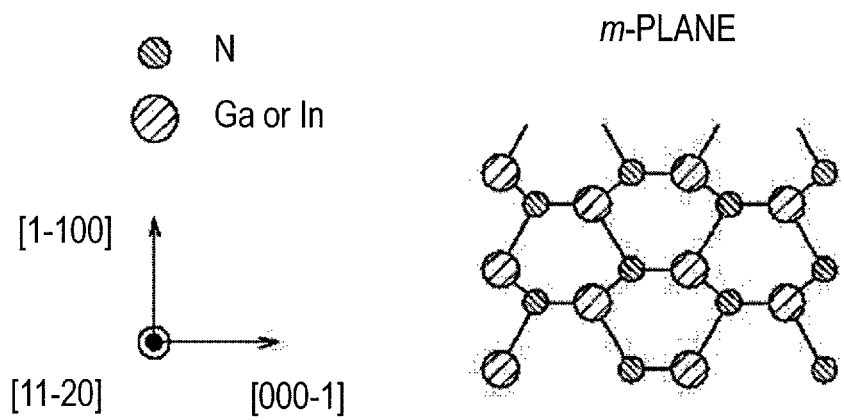
FIGS. 4A and 4B illustrate the crystal structures of an m-plane and a c-plane, respectively.

FIG. 4A schematically illustrates the crystal structure of a nitride-based semiconductor, of which the growing plane is an m-plane, as viewed on a cross section thereof that intersects with the principal surface of the substrate at right angles. Since Ga atoms and nitrogen atoms are present on the same atomic plane that is parallel to the m-plane, no electrical polarization will be produced perpendicularly to the m-plane.

That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain an m-plane nitride-based semiconductor multilayer structure that has grown perpendicularly to the m-plane, typically such an m-plane GaN-based substrate may be used and semiconductors may be grown on the m-plane of that substrate. This is because the crystallographic plane orientation of the semiconductor multilayer structure should be identical with that of the principal surface of the GaN-based substrate. However, the principal surface of the substrate does not always have to be an m-plane as described above, and the device as a final product could already have had its substrate removed.

Figure 4B:
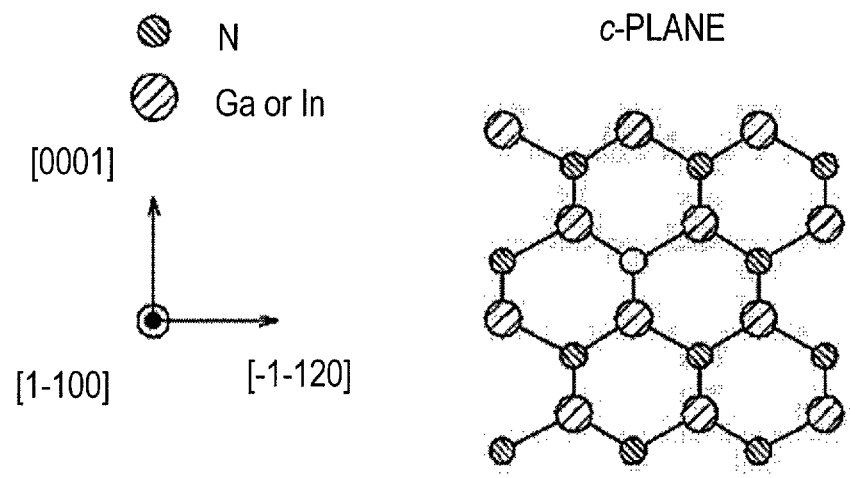

The crystal structure of a nitride-based semiconductor, of which the growing plane is a c-plane, as viewed on a cross section thereof that intersects with the principal surface of the substrate at right angles is illustrated schematically in FIG. 4B just for your reference. In this case, Ga atoms and nitrogen atoms are not present on the same atomic plane that is parallel to the c-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Now look at FIG. 3A again. On the growing plane (that is an m-plane) 12 of the m-plane GaN-based substrate 10, the semiconductor multilayer structure 20 has been formed. The semiconductor multilayer structure 20 includes an active layer 24 including an $Al_aIn_bGa_cN$ layer (where $a+b+c=1$, $a \geq 0$, $b \geq 0$ and $c \geq 0$), and an $Al_dGa_eN$ layer (where $d+e=1$, $d \geq 0$ and $e \geq 0$) 25, which is located on the other side of the active layer 24 opposite to the growing plane 12. In this case, the active layer 24 is an electron injection region of the nitride-based semiconductor light-emitting element 100.

The semiconductor multilayer structure 20 of this embodiment has other layers, one of which is an $Al_uGa_vIn_wN$ layer (where $u+v+w=1$, $u \geq 0$, $v \geq 0$ and $w \geq 0$) 22 that is arranged between the active layer 24 and the GaN-based substrate 10. The $Al_uGa_vIn_wN$ layer 22 of this embodiment has first conductivity type, which may be n-type, for example. Optionally, an undoped GaN layer could be inserted between the active layer 24 and the $Al_dGa_eN$ layer 25.

In the $Al_dGa_eN$ layer 25, the composition ratio d of Al does not have to be uniform, but could vary either continuously or stepwise, in the thickness direction. In other words, the $Al_dGa_eN$ layer 25 could have a multilayer structure in which a number of layers having mutually different Al composition ratios d are stacked one upon the other, or could have its dopant concentration varied in the thickness direction. To reduce the contact resistance, the uppermost portion of the $Al_dGa_eN$ layer 25 (i.e., the upper surface region of the semiconductor multilayer structure 20) may be a layer that has an Al composition ratio d of zero (i.e., a GaN layer). However, the Al composition ratio d does not have to be zero. Alternatively, an $Al_{0.05}Ga_{0.95}N$ layer, of which the Al composition ratio d is approximately 0.05, could also be used.

The $Al_dGa_eN$ layer 25 is doped with a dopant of a second conductivity type (p-type). As the p-type dopant, Mg is used generally but Zn, Be or any other appropriate element may be used as well.

There is a p-type contact region 26 in a portion of the $Al_dGa_eN$ layer 25 which is located closer to the growing plane. The p-type contact region 26 forms part of the $Al_dGa_eN$ layer 25 and the $Al_dGa_eN$ layer 25 does not have to have a multilayer structure having a definite boundary. In the p-type contact region 26, there are a larger number of Ga vacancies than in the $Al_dGa_eN$ layer 25. That is to say, since there is a large quantity of active dopant atoms to be replaced with Ga sites, the carrier concentration is high and the resistance is low there. To further reduce the contact resistance, the p-type contact region 26 may be doped with a p-type dopant more heavily than the $Al_dGa_eN$ layer 25. The p-type contact region 26 may have a thickness of not less than 10 nm and not more than 50 nm.

The electrode 30 is in contact with the p-type contact region 26 and functions as a p-electrode (which will be referred to herein as a "p-side electrode"). In this embodiment, the electrode 30 is in contact with the p-type contact region 26 which is doped with a dopant of the second conductivity type (i.e., p-type).

The electrode 30 includes Ag as its principal component and also includes Ge and at least one of Zn and Mg. The electrode 30 is formed of an alloy including 50 mass % or more of Ag and 50 mass % or less of Ge and at least one of Zn and Mg in total. More suitably, the concentration of Ag in the electrode 30 is 90 mass % or more and the combined concentration of Ge and at least one of Zn and Mg is 10 mass % or less. If the concentration of Ag is 90 mass % or more, the optical reflectance can be increased particularly significantly. At the interface with the semiconductor, Ge is suitably less than Zn or Mg. In a region of the electrode 30 which is up to 100 nm away from the interface with the semiconductor, Ge may be included at a concentration of 1 mass % or less, for example. If the concentration of Ge in the region of the electrode 30 which is up to 100 nm away from the interface with the semiconductor is 1 mass % or less, sufficiently low contact resistance can be obtained. Optionally, the concentration of Ge in the region of the electrode 30 which is up to 100 nm away from the interface with the semiconductor may even be 0.01 mass % or less. In that case, even lower contact resistance can be obtained. Furthermore, the concentration of Ge in the region of the electrode 30 which is up to 40 nm away from the interface with the semiconductor may also be 0.01 mass % or less. In that case, even lower contact resistance can be obtained.

Also, in the entire electrode 30, Ge may be included at a concentration of not less than 0.05 mass % and not more than 2.0 mass %, for example. If the concentration of Ge is 0.05 mass % or more, the electrode 30 can be made easily. Optionally, the concentration of Ge may be 1 mass % or less.

The electrode 30 includes Ga derived from the GaN-based semiconductor that the electrode 30 contacts with. The electrode 30 may include impurities to be inevitably contained during the manufacturing process (such as Ni, Cu, Pd, In, Sn, Nd, Sm, Pt, Au or Bi), but their combined concentration (i.e., the concentration of elements other than Ag, Mg, Zn, Ge and Ga) should be 0.1 mass % or less.

The electrode 30 may be a multilayer electrode consisting of an Ag layer, at least one of Zn and Mg layers, and a Ge layer. Alternatively, the electrode 30 may also have a structure in a part of which an Ag layer, at least one of Zn and Mg layers, and a Ge layer form an alloy. Still alternatively, the electrode 30 may even have a single-layer structure of an alloy in which Ge and at least one of Zn and Mg have diffused substantially uniformly in Ag.

To extract light efficiently from the light-emitting element 100, an electrode that absorbs little light (i.e., has high reflectance to incoming light) is suitably selected as is done in this embodiment. Or either an Ag layer or an alloy layer which includes Ag as its principal component may be formed so as to contact with the p-type contact region 26.

The electrode 30 includes Ag as its principal component and also includes Ge and at least one of Zn and Mg. A metal layer 31 may be arranged on its upper surface (i.e., the surface that faces the interface with the semiconductor). The metal layer 31 may contact with only the upper surface of the electrode 30 as shown in FIG. 3B or may cover the upper and side surfaces thereof as shown in FIGS. 3A and 3C.

As described above, Ag will react easily with other substances (such as oxygen, sulfur, halogen and water) to often cause a decrease in reflectance. If an alloy of Ag is used, then the reflectance will decrease less quickly than when pure Ag is used. Considering the reliability, however, the electrode 30 should have a structure that can break off contact with those easily reacting substances. That is to say, it is recommended that the electrode 30 be in contact with either only the p-type contact region 26 and the metal layer 31 as shown in FIG. 3A or only the p-type contact region 26, the metal layer 31 and the insulating film 50 as shown in FIGS. 3B and 3C.

The insulating film 50 may be formed of silicon oxide ($SiO_x$), silicon nitride ($SiN_x$) or any other general insulator, but does not have to have a uniform composition everywhere. For example, a region of the insulating film 50 which contacts with the semiconductor multilayer structure 20 or the electrode 30 may be formed of $SiO_x$, but its surface (i.e., the surface that faces the interface with the semiconductor) may be formed of $SiN_x$. Generally speaking, as a nitride is hydrophobic, the insulating film 50 of a nitride can reduce contact between the electrode 30 and water, compared to when an oxide is used.

As a material for the metal layer 31, either an alloy with low optical reflectance which will diffuse inside the electrode 30 or a metal which will not cause a decrease in contact resistance may be selected. Specifically, as a material for the metal layer 31, a metal such as Ti, Fe, W, Pd, Pt, Ni or Mo which will not mix with the Ag layer easily, or will not diffuse easily in $Al_xGa_yIn_zN$ (where x+y+z=1, x≥0, y≥0 and z≥0), or would not cancel, the dopant even if the metal diffused, may be selected.

In this embodiment, the electrode 30 may have a thickness that falls within the range of not less than 20 nm and not more than 500 nm, for example. If the electrode 30 has a thickness of 20 nm or more, aggregation will not occur easily during the heat treatment to be described later, thus preventing the material of the electrode 30 from aggregating together and forming islands easily. On the other hand, if the electrode 30 has a thickness of 500 nm or less, then an increase in strain can be avoided, and therefore, the electrode 30 will not peel off easily.

Meanwhile, the GaN-based substrate 10, of which the growing plane 12 is an m-plane, may have a thickness of 100 µm to 400 µm, for example. This is because if the wafer has a thickness of at least approximately 100 µm, then there will be no trouble handling such a wafer. It should be noted that as long as the GaN-based substrate 10 of this embodiment has an m-plane growing plane 12 formed of a GaN-based material, the substrate 10 could have a multilayer structure. That is to say, the GaN-based substrate 10 of this embodiment could also refer to a substrate, at least the growing plane 12 of which is an m-plane. That is why the entire substrate could be formed of a GaN-based material. Or the substrate may also be formed of the GaN-based material and another material in any combination.

In the structure of this embodiment, an electrode 40 has been formed as an n-side electrode on a portion of an n-type $Al_uGa_vIn_wN$ layer 22 having a thickness of 0.2 µm to 2 µm, for example. In the example illustrated in FIG. 3A, in the region of the semiconductor multilayer structure 20 where the electrode 40 is arranged, a recess 42 has been formed so as to expose a portion of the n-type $Al_uGa_vIn_wN$ layer 22. And the electrode 40 has been formed on the growing plane of the n-type $Al_uGa_vIn_wN$ layer 22 that is exposed at the bottom of the recess 42. The electrode 40 may have a multilayer structure consisting of Al and Pt layers and may have a thickness of 100 nm to 200 nm, for example.

In this embodiment, the active layer 24 has a GaInN/GaN multi-quantum well (MQW) structure having a thickness of 81 nm, for example, in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 25, which may have a thickness of 0.2 µm to 2 µm. Optionally, an undoped GaN layer could be inserted between the active layer 24 and the $Al_dGa_eN$ layer 25 as described above.

Hereinafter, it will be described with reference to FIG. 3 once again how to fabricate the nitride-based semiconductor light-emitting element 100 of this embodiment.

First of all, an m-plane GaN-based substrate 10 is prepared. In this embodiment, a GaN substrate is used as the GaN-based substrate 10. The GaN substrate of this embodiment is obtained by HVPE (hydride vapor phase epitaxy).

For example, a thick GaN film is grown to a thickness of several millimeters on a c-plane sapphire wafer, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a Na flux method or a melt growth process such as an ammono-thermal method and then diced parallel to the m-plane.

The GaN-based substrate 10 may be replaced with a gallium oxide substrate, an SiC substrate, an Si substrate or a sapphire substrate, for example. To grow an m-plane GaN-based semiconductor on the substrate by epitaxy, it is recommended that the principal surface of the SiC or sapphire substrate be an m-plane, too. However, in some instances, a-plane GaN could grow on an r-plane sapphire substrate. That is why according to the growth conditions, the surface on which the crystal growth should take place does not always have to be an m-plane. In any case, at least the growing plane of the semiconductor multilayer structure 20 should be an m-plane. In this embodiment, crystal layers are formed one after another on the GaN-based substrate 10 by MOCVD (metalorganic chemical vapor deposition) method.

Next, an $Al_uGa_vIn_wN$ layer 22 is formed on the m-plane GaN-based substrate 10. As the $Al_uGa_vIn_wN$ layer 22, AlGaN may be deposited to a thickness of 3 µm, for example. A GaN layer may be deposited by supplying $TMG(Ga(CH_3)_3)$, TMA $(Al(CH_3)_3)$ and $NH_3$ gases onto the m-plane GaN-based substrate 10 at 1100 degrees Celsius, for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth may be lowered to 800 degrees Celsius to introduce In.

Thereafter, an undoped GaN layer is deposited to a thickness of 30 nm, for example, on the active layer 24, and then an $Al_dGa_eN$ layer 25 is formed on the undoped GaN layer. As the $Al_dGa_eN$ layer 25, p-$Al_{0.14}Ga_{0.86}N$ is deposited to a thickness of 70 nm by supplying TMG, $NH_3$, TMA, TMI gases and $Cp_2Mg$ (cyclopentadienyl magnesium) gas as a p-type dopant. When a portion of the $Al_dGa_eN$ layer 25 to be located closer to the growing plane is deposited to a thickness of 20 nm, for example, the rate of supplying $Cp_2Mg$ may be increased in order to form a p-type contact region 26 having an Mg concentration of $7\times10^{19}$ atoms/cm$^3$.

The semiconductor multilayer structure 20 that has been fabricated in this manner on the GaN-based substrate 10 is then ultrasonic cleaned with acetone and ethanol to remove organic substances, particles and other kinds of contamination. Thereafter, a resist pattern is formed on the surface of the p-type contact region 26. Then, respective portions of the p-type contact region 26, the $Al_dGa_eN$ layer 25, the undoped GaN layer, and the active layer 24 are removed by performing a chlorine-based dry etching process, thereby making a recess 42 and exposing a region of the $Al_uGa_vIn_wN$ layer 22 where an n-side electrode will be formed.

Next, an electrode 40 is formed on a region reserved for an n-side electrode at the bottom of the recess 42. In making the electrode 40, Ti, Al and Pt layers are deposited in this order by a vacuum deposition process (such as a resistance heating method or an electron beam method) or a sputtering process.

Next, an electrode 30 is formed on the p-type contact region 26. For example, Zn, Ge and Ag may be deposited in this order by an electron beam evaporation method to thicknesses of 0.5 nm, 0.5 nm and 400 nm, respectively, and then subjected to a heat treatment at 500 degrees Celsius for ten minutes in an atmosphere in which nitrogen and oxygen are mixed at the ratio of ten to one. This heat treatment may be carried out at a temperature of not less than 400 and not more than 600 degrees Celsius, for example. In that case, Zn and Ge will respectively account for approximately 0.085 mass % and approximately 0.063 mass % of the entire mass of the electrode 30.

In this process step, the Zn and Ge layers may be both deposited to a thickness of not less than 0.5 nm and not more than 10 nm, for example. By depositing Ge to a thickness of 0.5 nm or more, the Ge layer can be formed with good controllability. In addition, by setting the thickness of Ge to be 10 nm or less, the reflectance of light from the electrode can be kept within a high range. The Ag layer may have a thickness of not less than 50 nm and not more than 500 nm, for example. If the thickness of the Ag layer falls within thus range, aggregation of Ag can be reduced. Also, Zn, Ge and Ag may respectively account for not less than 0.05 mass % and not more than 10 mass %, not less than 0.05 mass % and not more than 10 mass %, and not less than 80 mass % and not more than 99.9 mass % of the entire electrode.

It should be noted that in forming the electrode 30, those elements do not have to be deposited in the order described above but may also be deposited in the order of Ge, Zn and Ag, for example. For instance, after Zn has been deposited, an Ag layer including Ge may be deposited. Alternatively, a Ge—Zn—Ag alloy layer may also be deposited. Still alternatively, Mg may be used either instead of, or in addition to, Zn.

The electron beam evaporation is a method for getting a source material absorbed and deposited onto the surface of a sample by turning the source material into vapor using an electron beam. The electrode 30 may include not only Zn and Ge but also various impurities (such as Ni, Cu, Pd, In, Sn, Nd, Sm, Pt, Au and Bi) to be inevitably contained while metal pellets of the source material are being made. The sum of those impurities may account for at most 0.1 mass %. By being subjected to the heat treatment, Zn, Ge and Ag that form the electrode 30 produce inter-diffusion and turn into an alloy. The electrode 30 does not have to be a uniform alloy but may also be partially segregated or have a multilayer structure as well. In the following description, the structure of the electrode 30 will be indicated herein by m-(Zn, Ge) Ag, for example, which refers herein to a metal film that has been formed on a GaN-based semiconductor, of which the growing plane is an m-plane, and that includes Ag as its principal component and also includes Zn and Ge.

Figure 5A:
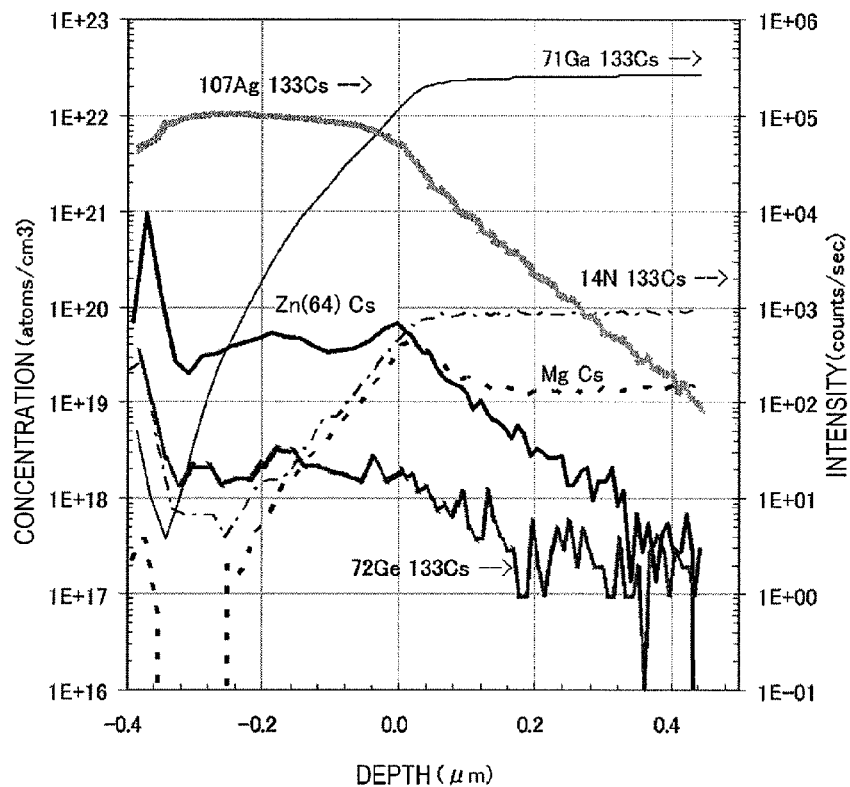
FIG. 5A shows a depth direction profile of m-(Zn, Ge) Ag which was obtained by SIMS analysis.

FIG. 5A shows the results of a SIMS (secondary ion-microprobe mass spectrometry) that was carried out on the m-(Zn, Ge) Ag electrode that had been made by the method of this embodiment. By making $Cs^+$ incident as primary ions onto the sample and by measuring the mass of the secondary ions sputtered, a depth direction profile about the constituent elements of the sample and their quantities could be obtained. The concentrations of Zn and Mg are plotted as ordinates on the left-hand side (in atoms/cm$^3$) and the detection intensities of the other elements are plotted as ordinates on the right-hand side. The distance as the abscissa was calculated after the SIMS based on the depth of the sputter craters on the supposition that the sputter rate was constant. And a range where the intensity of Ga decreased to a half was defined to be the interface between the electrode and the semiconductor (where distance=0). As can be seen easily from FIG. 5A, in the electrode in which Zn, Ge and Ag had been deposited and which had been subjected to a heat treatment at 50 degrees Celsius for 10 minutes, Zn and Ge had not formed layers but had diffused in the film of Ag as principal component.

As also can be seen easily from FIG. 5A, the electrode (corresponding to a range of −0.4 to 0.0 on the axis of abscissas) included Ga that had diffused from the semiconductor. And the more distant from the interface with the semiconductor, the lower the concentration of Ga in the electrode.

Subsequently, a metal layer 31 is formed on the upper surface of the electrode 30. The metal layer 31 may be a Ti film having a thickness of 200 nm, for example. The metal layer 31 may be either a single layer or a multilayer structure and may include Ti, Pt, Mo, Pd, Au or W, for example. If the upper surface and sidewall of the electrode 30 are covered with the metal layer 31 as shown in FIGS. 3A and 3C, then the electrode 30 is not exposed to the air, and therefore, migration of Ag and its corrosion such as sulfuration, oxidation and halogenation can be reduced. The film that prevents the electrode 30 from being exposed to the air does not have to be formed of a metal in its entirety. Alternatively, as shown in FIG. 3B, the electrode 30 may also have its upper surface covered with the metal layer 31 and have its side surface covered with a portion of the insulating film 50. As the insulating film 50, $SiN_x$ having a thickness of approximately 400 nm may be used, for example.

Furthermore, a wiring metal (such as Au or AuSn) may be formed on the metallic protective electrode or dielectric protective film described above.

Optionally, the GaN-based substrate 10 and a portion of the $Al_uGa_vIn_wN$ layer 22 could be removed after that by some technique such as laser lift-off, etching or polishing. In that case, either only the GaN-based substrate 10 or the GaN-based substrate 10 and a portion of the $Al_uGa_vIn_wN$ layer 22 could be removed selectively. It is naturally possible to leave the GaN-based substrate 10 and the $Al_uGa_vIn_wN$ layer 22 as they are without removing them. By performing these process steps, the nitride-based semiconductor light-emitting element 100 of this embodiment is completed.

In the nitride-based semiconductor light-emitting element 100 of this embodiment, when a voltage is applied between the electrodes 40 and 30, holes are injected from the electrode 30 into the active layer 24 and electrons are injected from the electrode 40 into the active layer 24, thus producing photoluminescence with a wavelength of about 450 nm.

The features of the m-(Zn, Ge) Ag electrode made by the method of this embodiment will be described with reference to FIGS. 5A through 6B.

Figure 5B:
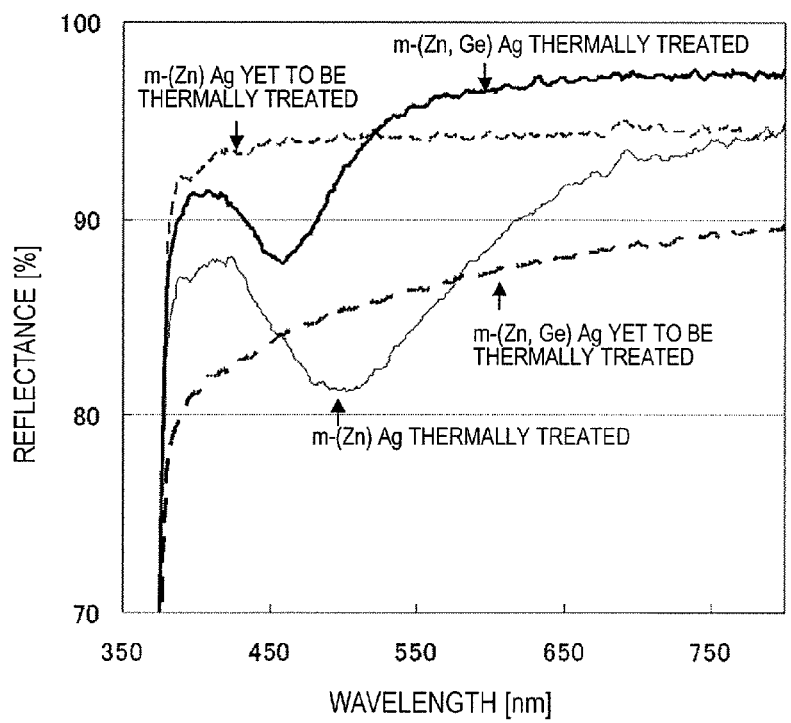
FIG. 5B shows optical reflectances of m-(Zn) Ag and m-(Zn, Ge) Ag before and after a heat treatment.

FIG. 5B shows the results of measurement of the reflectance of the sample m-(Zn, Ge) Ag in which Zn, Ge and Ag layers had been deposited to thicknesses of 0.5 nm, 0.5 nm and 400 nm, respectively, on m-plane GaN, and the reflectance of another sample m-(Zn) Ag in which Zn and Ag layers had been deposited to thicknesses of 0.5 nm and 400 nm, respectively, on m-plane GaN. The reflectances were measured by making the light that had come from over the GaN-based substrate 10 incident at an angle of incidence of 5 degrees. The reflectances dropped at wavelengths of 375 nm or less due to absorption of the light into the GaN-based substrate 10. The reflectance of m-(Zn) Ag was as high as 94% in a wavelength range of 375 nm or more before the heat treatment but decreased in the entire wavelength range after the heat treatment had been carried out at 500 degrees Celsius for 10 minutes in an atmosphere in which nitrogen and oxygen had been mixed together at a ratio of ten to one.

On the other hand, it can be seen that m-(Zn, Ge) Ag had low reflectance and Ge absorbed a lot of light before the heat treatment. However, m-(Zn, Ge) Ag had increased reflectance after having been subjected to the heat treatment. As can be seen from the results of the SIMS shown in FIG. 5A, this is probably because Ge as well as Zn would have diffused toward the metal film and absorption of light would have decreased in the vicinity of the interface with the semiconductor. In the entire wavelength range under measurement, the reflectance after the heat treatment was higher in m-(Zn, Ge) Ag than in m-(Zn) Ag and was 88% at a wavelength of 450 nm and 94% at a wavelength of 520 nm. According to this embodiment, by adding Ge to the electrode 30, the reflectance to the light having a wavelength of 450 nm can be increased to 85% or more and the reflectance to the light having a wavelength of 520 nm can be increased to 90% or more.

Meanwhile, look at the reflectances after the heat treatment, and it can be seen that a singular decrease in reflectance was observed in the vicinity of a wavelength of 500 nm in m-(Zn) Ag and a singular decrease in reflectance was observed in the vicinity of a wavelength of 460 nm in m-(Zn, Ge) Ag. This should have been caused by pinholes or grain boundary that had been produced by aggregation of Ag. And the degree of decrease in reflectance and the wavelength range in which the reflectance decreases would vary according to the kinds and concentrations of the elements to be added to Ag and the atmosphere and temperature condition of the heat treatment.

Figure 6A:
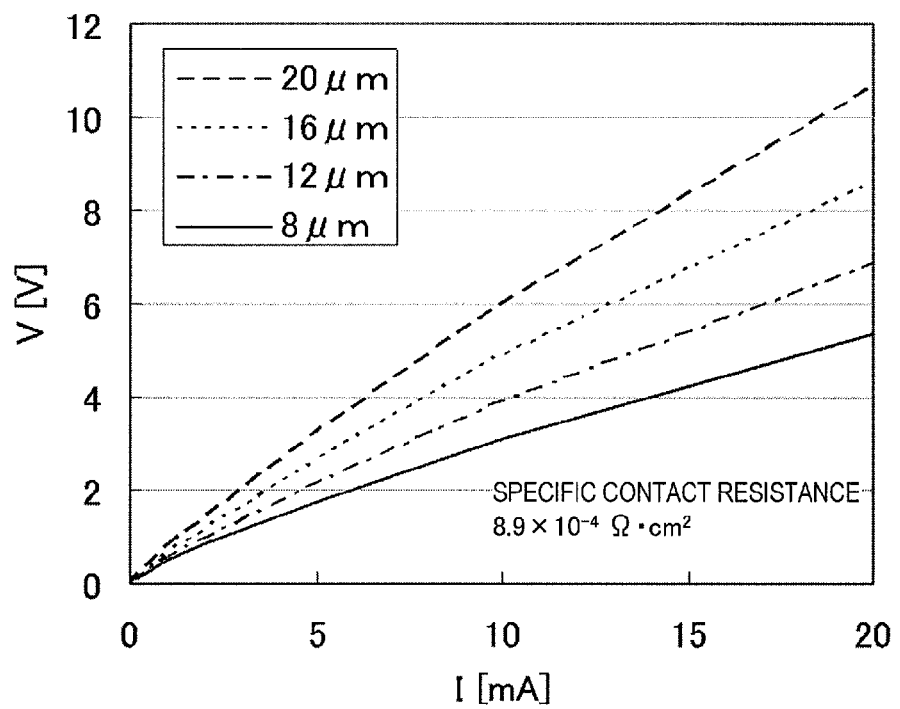
FIG. 6A shows the current-voltage characteristics that were obtained by TLM measurement before and after m-(Zn, Ge) Ag was thermally treated.
Figure 6B:
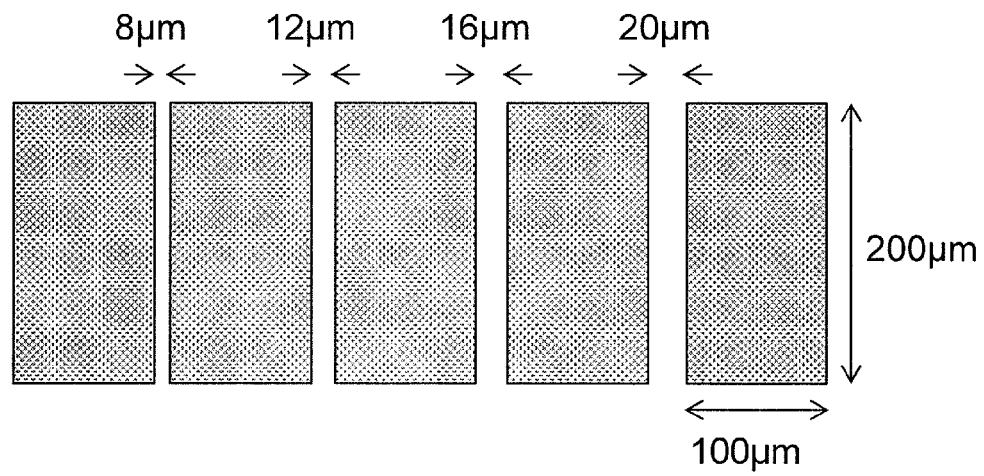
FIG. 6B illustrates a TLM electrode pattern.

FIG. 6A shows the results of a TLM (transmission line method) measurement that was carried out on the m-(Zn, Ge) Ag electrodes that had been made by the method of this embodiment. The TLM measurement is a method for calculating the specific contact resistance by making current-voltage measurement between the electrode pattern shown in FIG. 6B. The specific contact resistance of the m-(Zn, Ge) Ag electrode was as low as $8.4\times10^{-4}$ $\Omega\cdot cm^2$ on average. Generally speaking, the contact resistance is inversely proportional to the area S ($cm^2$) of the contact. In this case, supposing R ($\Omega$) is contact resistance, the equation R=Rc/S should be satisfied.

The constant of proportionality Rc is called "specific contact resistance" and corresponds to contact resistance R when the contact area S is 1 $cm^2$. That is to say, the magnitude of the specific contact resistance does not depend on the contact area S and can be used as an index to evaluating the characteristics of a contact. In the following description, the "specific contact resistance" will be sometimes referred to herein as just "contact resistance".

Comparative Experiment 1

A semiconductor multilayer structure 20 was formed in the same way as in the embodiment described above, various electrodes including Ag as their principal component were formed on the p-type contact region 26, and the TLM measurement was carried out. The specific contact resistances thus measured are shown in Table 1.

Figure 7A:
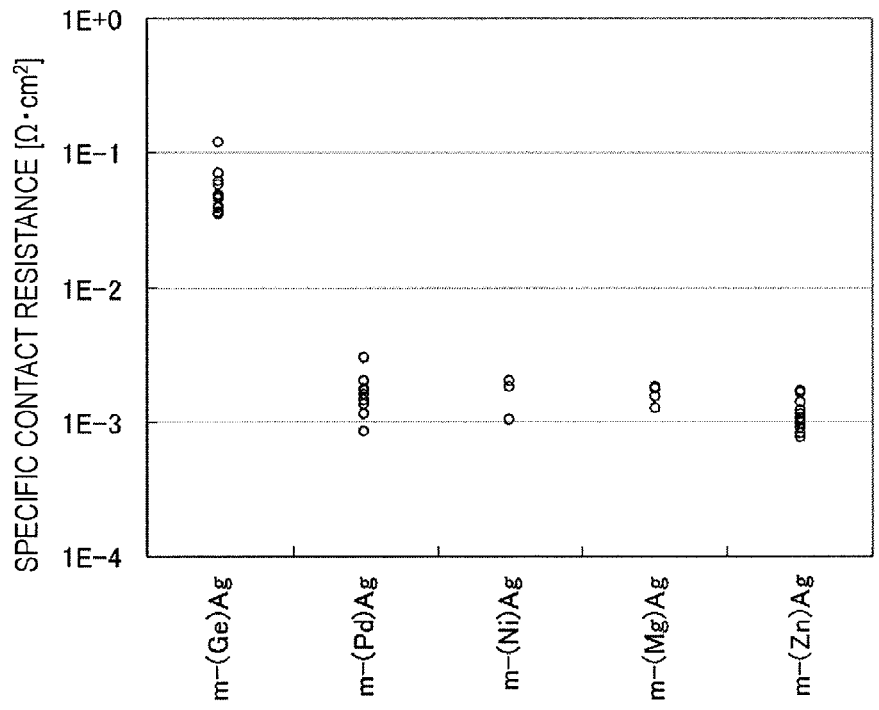
FIGS. 7A and 7B are graphs showing specific contact resistances that were calculated based on the results of the TLM measurement.

FIG. 7A shows the specific contact resistances that were measured on an m-(Ge) Ag electrode, an m-(Pd) Ag electrode, an m-(Ni) Ag electrode, an m-(Mg) Ag electrode, and an m-(Zn) Ag electrode. To make each of these electrodes, a kind of metal selected from Ge, Pd, Ni, Mg and Zn was deposited to a thickness of 0.5 nm on the p-type contact region 26, an Ag layer was deposited to a thickness of 400 nm on that metal, and then a heat treatment was carried out at a temperature of 500 degrees Celsius for 10 minutes in an atmosphere in which nitrogen and oxygen were mixed together at a ratio of ten to one. It should be noted that the ordinates "1E−1" and "1E−2" mean "$1\times10^{-1}$" and "$1\times10^{-2}$", respectively. That is to say, "1E+X" means "$1\times10^X$".

As shown in FIG. 7A, each of the m-(Pd) Ag electrode, m-(Ni) Ag electrode, m-(Mg) Ag electrode, and m-(Zn) Ag electrode had as low a contact resistance as 1 to $2\times10^{-3}$ $\Omega\cdot cm^2$ but only the m-(Ge) Ag electrode had as high a contact resistance as $7.5\times10^{-2}$ $\Omega\cdot cm^2$. As Pd and Ni have been used as materials for the p-side electrode of conventional c-plane GaN-based semiconductor elements, Pd and Ni have a work function which is large enough to make an ohmic contact easily. On the other hand, as disclosed in Japanese Patent Publications No. 4568379 and No. 4568380, in an electrode including Mg or Zn, if Mg or Zn had been deposited on an m-plane GaN and then subjected to a heat treatment, Ga atoms would have been extracted from the semiconductor layer to create Ga vacancies functioning as acceptors and cause a decrease in contact resistance. However, it was believed that compensation between the p-type and n-type dopants occurred to cause an increase in the contact resistance of the m-(Ge) Ag electrode, since Ge is an element that has a small work function and that functions as an n-type dopant.

Figure 7B:
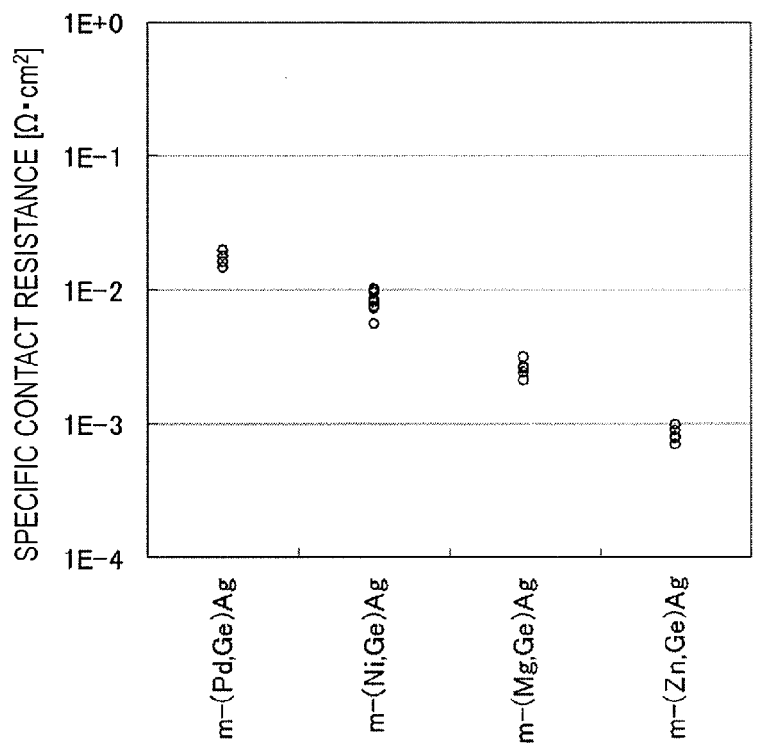

FIG. 7B shows the specific contact resistances that were measured on an m-(Pd, Ge) Ag electrode, an m-(Ni, Ge) Ag electrode, an m-(Mg, Ge) Ag electrode, and an m-(Zn, Ge) Ag electrode. To make each of these electrodes, a kind of metal selected from Pd, Ni, Mg and Zn was deposited to a thickness of 0.5 nm on the p-type contact region 26, a Ge layer was deposited to a thickness of 0.5 m on that metal, an Ag layer was deposited to a thickness of 400 nm thereon, and then a heat treatment was carried out at a temperature of 500 degrees Celsius for 10 minutes in an atmosphere in which nitrogen and oxygen were mixed together at a ratio of ten to one. As described above, since Ge would have an adverse effect on the p-side electrode, the contact resistances of the m-(Pd, Ge) Ag electrode, m-(Ni, Ge) Ag electrode, and m-(Mg, Ge) Ag electrode were higher than those of the m-(Pd) Ag electrode, m-(Ni) Ag electrode, and m-(Mg) Ag electrode, which were used no Ge. However, the contact resistance of the m-(Zn, Ge) Ag electrode was $8.4 \times 10^{-4}$ $\Omega \cdot cm^2$ in average, which was lower than that of the m-(Zn) Ag electrode.

Now let us consider with reference to FIGS. 8A, 8B, 9A, 9B and 9C why these results were obtained.

Figure 8A:
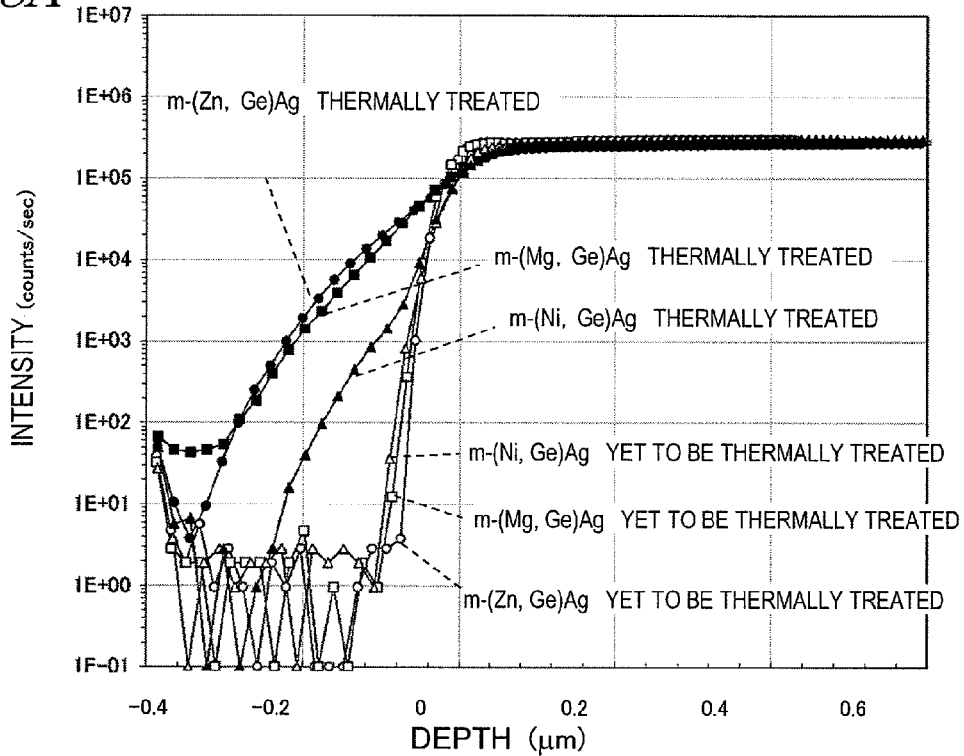
FIG. 8A shows Ga profiles that were obtained in the depth direction by carrying out a SIMS analysis on m-(Ni, Ge) Ag, m-(Mg, Ge) Ag, and m-(Zn, Ge) Ag.

FIG. 8A shows the Ga profiles that were obtained by the SIMS measurement. In FIG. 8A, the Ga profiles obtained before and after the m-(Ni, Ge) Ag electrode was thermally treated are plotted with Δ and ▲, respectively, the Ga profiles obtained before and after the m-(Mg, Ge) Ag electrode was thermally treated are plotted with □ and ■, respectively, and the Ga profiles obtained before and after the m-(Zn, Ge) Ag electrode was thermally treated are plotted with ○ and ●, respectively. The Ga profiles obtained before these three kinds of electrodes were thermally treated were almost the same and overlapped with each other. However, changes were seen in the Ga profiles obtained after those electrodes were thermally treated. Specifically, Ga is diffused toward the electrode (i.e., in the negative direction on the axis of abscissas), and the quantities of diffused Ga atoms are increased in the order of the m-(Zn, Ge) Ag electrode, the m-(Mg, Ge) Ag electrode, and the m-(Ni, Ge) Ag electrode. As described above, it can be seen that when Mg and Zn were used, Ga included in m-plane GaN diffused toward the electrode to create a lot of Ga vacancies.

Figure 8B:
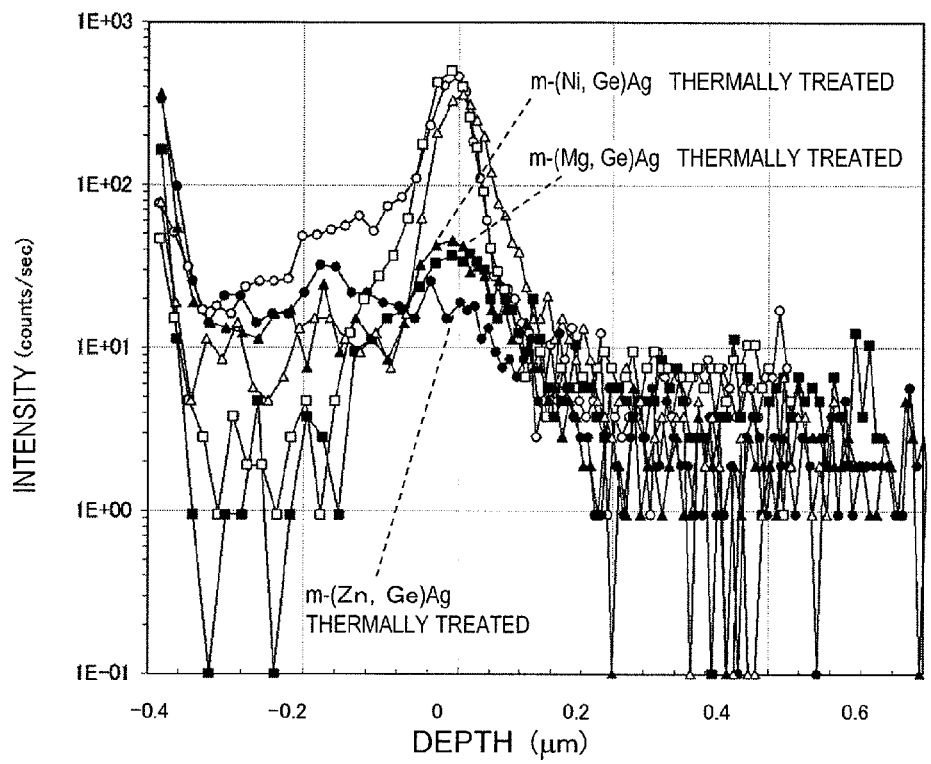
FIG. 8B shows Ge profiles that were obtained in the depth direction by carrying out a SIMS analysis on m-(Ni, Ge) Ag, m-(Mg, Ge) Ag, and m-(Zn, Ge) Ag.

FIG. 8B shows the Ge profiles that were obtained by the SIMS measurement. In FIG. 8B, the Ge profiles obtained before and after the m-(Ni, Ge) Ag electrode was thermally treated are plotted with Δ and ▲, respectively, the Ge profiles obtained before and after the m-(Mg, Ge) Ag electrode was thermally treated are plotted with □ and ■, respectively, and the Ge profiles obtained before and after the m-(Zn, Ge) Ag electrode was thermally treated are plotted with ○ and ●, respectively. Before these three kinds of electrodes were thermally treated, peaks indicating that there were a lot of Ge atoms in the vicinity of the interface with the semiconductor were seen in all of those electrodes. Once subjected to the heat treatment, however, those Ge atoms diffused toward those electrodes. Meanwhile, look at the interface with the semiconductor that had been thermally treated, and it can be seen that the intensity of Ge increased in the order of m-(Ni, Ge) Ag, m-(Mg, Ge) Ag and m-(Zn, Ge) Ag and that Ge atoms compensating for the acceptors remained.

The total quantity of Ge in the thermally treated m-(Zn, Ge) Ag electrode accounted for approximately 0.06 mass %, and the integrated intensity as measured in a region of the electrode from the interface with the semiconductor toward the electrode to a distance of 100 nm was approximately 14%. That is why there would have been approximately 0.009 mass % (=0.06×0.14) of Ge. On the other hand, the concentration of Ge as measured in the thermally treated m-(Ni, Ge) Ag electrode from the interface toward the electrode to a distance of 100 nm was approximately 0.015 mass %. Furthermore, the concentration of Ge as measured in the thermally treated m-(Mg, Ge) Ag electrode from the interface toward the electrode to a distance of 100 nm was approximately 0.017 mass %.

Meanwhile, the concentration of Ge as measured in the thermally treated m-(Zn, Ge) Ag electrode from the interface toward the electrode to a distance of 40 nm was approximately 0.005 mass %. The concentration of Ge as measured in the thermally treated m-(Ni, Ge) Ag electrode from the interface toward the electrode to a distance of 40 nm was approximately 0.011 mass %. And the concentration of Ge as measured in the thermally treated m-(Mg, Ge) Ag electrode from the interface toward the electrode to a distance of 40 nm was approximately 0.012 mass %. The following Table 1 shows how the concentration of Ge changed with the distance from the interface with the semiconductor in those electrodes that had been thermally treated. As can be seen from Table 1, the Ge concentration at the interface between the electrode and the semiconductor (semiconductor/metal interface) was lower than the Ge concentration at the surface of the electrode (metal surface) opposite from the semiconductor.

TABLE 1

| | ZnGeAg | | MgGeAg | | NiGeAg | |
| | Ge total [wt %] | | | | | |
| | 0.063 | | 0.063 | | 0.063 | |
| | Depth [nm] | wt % | Depth [nm] | wt % | Depth [nm] | wt % |
|---|---|---|---|---|---|---|
| Metal surface | 386 | 0.063 | 389 | 0.063 | 389 | 0.063 |
| | 365 | 0.037 | 368 | 0.042 | 368 | 0.034 |
| | 345 | 0.029 | 347 | 0.022 | 347 | 0.029 |
| | 324 | 0.027 | 326 | 0.020 | 327 | 0.028 |
| | 304 | 0.026 | 305 | 0.020 | 306 | 0.026 |
| | 284 | 0.024 | 285 | 0.020 | 285 | 0.025 |
| | 263 | 0.023 | 264 | 0.020 | 264 | 0.024 |
| | 243 | 0.022 | 243 | 0.020 | 243 | 0.023 |
| | 222 | 0.020 | 222 | 0.019 | 222 | 0.022 |
| | 202 | 0.019 | 201 | 0.019 | 201 | 0.021 |
| | 181 | 0.017 | 181 | 0.019 | 181 | 0.020 |
| | 161 | 0.015 | 160 | 0.019 | 160 | 0.018 |
| | 141 | 0.012 | 139 | 0.018 | 139 | 0.017 |
| | 120 | 0.011 | 118 | 0.018 | 118 | 0.016 |
| | 100 | 0.009 | 98 | 0.017 | 97 | 0.015 |
| | 79 | 0.007 | 77 | 0.016 | 76 | 0.014 |
| | 59 | 0.006 | 56 | 0.014 | 55 | 0.013 |
| | 38 | 0.005 | 35 | 0.012 | 35 | 0.011 |
| | 18 | 0.003 | 14 | 0.009 | 14 | 0.007 |
| Semiconductor/metal interface | 0 | 0.001 | 0 | 0.005 | 0 | 0.003 |

Figure 9A:
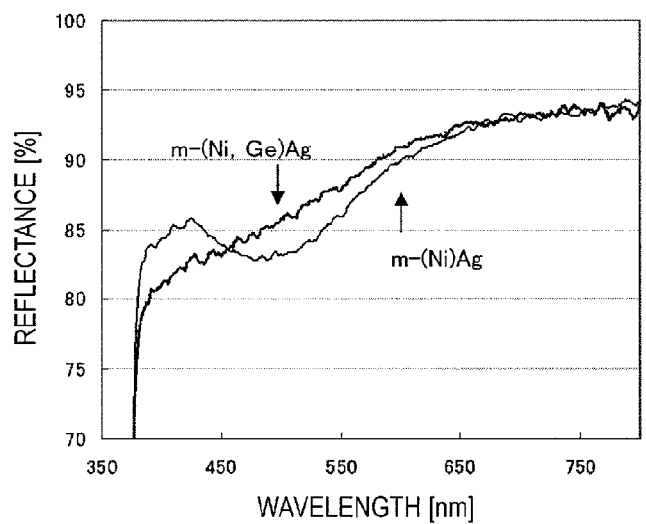
FIGS. 9A, 9B and 9C show the respective optical reflectances of m-(Ni, Ge) Ag, m-(Mg, Ge) Ag and m-(Zn, Ge) Ag.
Figure 9B:
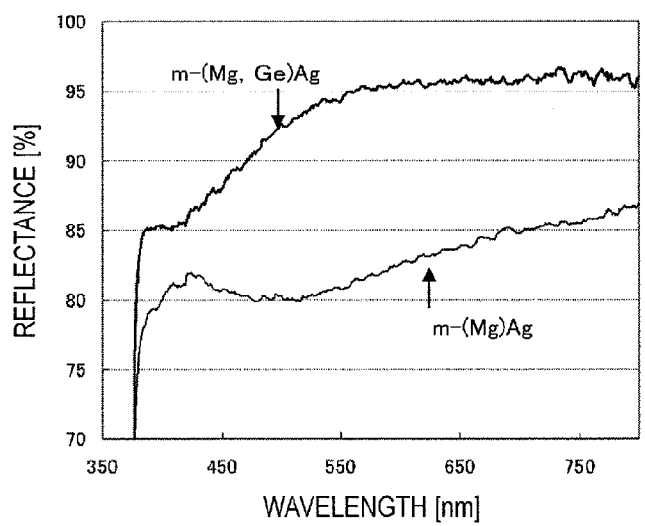
Figure 9C:
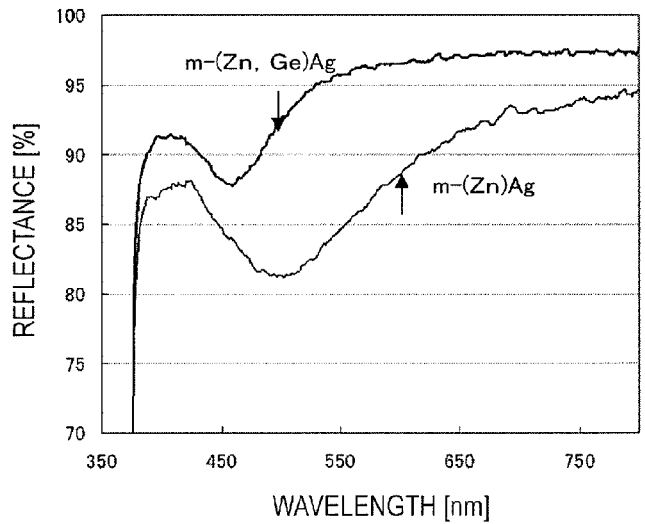

FIG. 9A shows the reflectances as measured on the thermally treated m-(Ni, Ge) Ag and m-(Ni) Ag electrodes. FIG. 9B shows the reflectances as measured on the thermally treated m-(Mg, Ge) Ag and m-(Mg) Ag electrodes. And FIG. 9C shows the reflectances as measured on the thermally treated m-(Zn, Ge) Ag and m-(Zn; Ag electrodes. In each of these three cases, by using Ge, the reflectance increased. Comparing their reflectances at a blue LED's emission wavelength of 450 mm, which is used generally, it can be seen that the reflectance increased in the order of m-(Zn, Ge) Ag, m-(Mg, Ge) Ag and m-(Ni, Ge) Ag. These results are not contradictory to the Ge profiles shown in FIG. 8B. That is to say, the more easily Ge that easily absorbs light can diffuse from the interface with the semiconductor in an electrode, the higher the reflectance of that electrode.

Taking these results into consideration, it can be said that the more easily the Ga vacancies are created, the lower the specific contact resistance and that the more easily Ge atoms diffuse from the interface with the semiconductor toward the surface of the electrode, the lower the specific contact resistance. Also, if a lot of Ge atoms stayed at the interface with the semiconductor, then light would be absorbed unintentionally. That is why in the case of a manufacturing process in which multiple metal layers are stacked one upon the other, subjected to a heat treatment, and alloyed together as is done in the embodiment described above, the electrode is suitably configured so as to allow Ge atoms to diffuse from the interface with the semiconductor toward the surface of the electrode easily. That is to say, in this experiment, the m-(Zn, Ge) Ag electrode achieved a low contact resistance and a high reflectance, probably because Ga vacancies would have been created easily and Ge would have diffused easily toward the surface in such an electrode.

In addition, considering these results, it can be said that by adopting a manufacturing process in which an Mg layer is deposited on the p-type contact region 26, an alloy including, as its principal component, Ag having a very small amount (e.g., 0.05 mass % or less) of Ge is deposited on the Mg layer, and then a heat treatment is carried out, Ga vacancies can be created effectively by Mg and an interface with the semiconductor in which no Ge is segregated can be obtained. That is to say, the same effects as what is achieved by the m-(Zn, Ge) Ag electrode described above would be achieved, too.

Comparative Experiment 2

Figure 10:
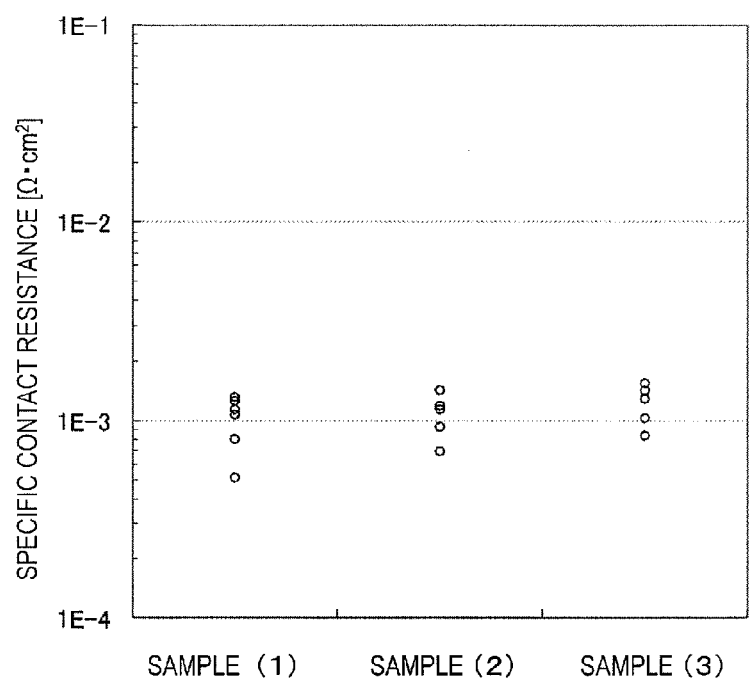
FIG. 10 is a graph showing specific contact resistances that were calculated based on the results of a TLM measurement that had been carried out on m-(Zn, Ge) Ag.

FIG. 10 shows the results of a TLM measurement which was carried out on an electrode that included Ag as its principal component and also included Zn and Ge and that was formed on an m-plane p-type contact region.

Sample (1) was obtained by depositing a Zn layer to a thickness of 0.2 nm on the m-plane p-type contact region, depositing Ge to a thickness of 0.5 nm thereon, and then depositing Ag to a thickness of 400 nm thereon.

Sample (2) was obtained by depositing a Zn layer to a thickness of 0.5 nm on the m-plane p-type contact region, depositing Ge to a thickness of 0.5 nm thereon, and then depositing Ag to a thickness of 400 nm thereon.

Sample (3) was obtained by depositing a Ge layer to a thickness of 0.5 nm on the m-plane p-type contact region, depositing Zn to a thickness of 0.5 nm thereon, and then depositing Ag to a thickness of 400 nm thereon.

These Samples (1), (2) and (3) were subjected to a heat treatment at a temperature of 500 degrees Celsius for 10 minutes in an atmosphere in which nitrogen and oxygen were mixed together at a ratio of ten to one. As shown in FIG. 10, in all of these samples, the specific contact resistance was approximately $1 \times 10^{-3}$ $\Omega \cdot$cm. These results reveal that a low-resistance p-side electrode could be formed by any of the manufacturing processes described above.

Comparative Experiment 3

Figure 11:
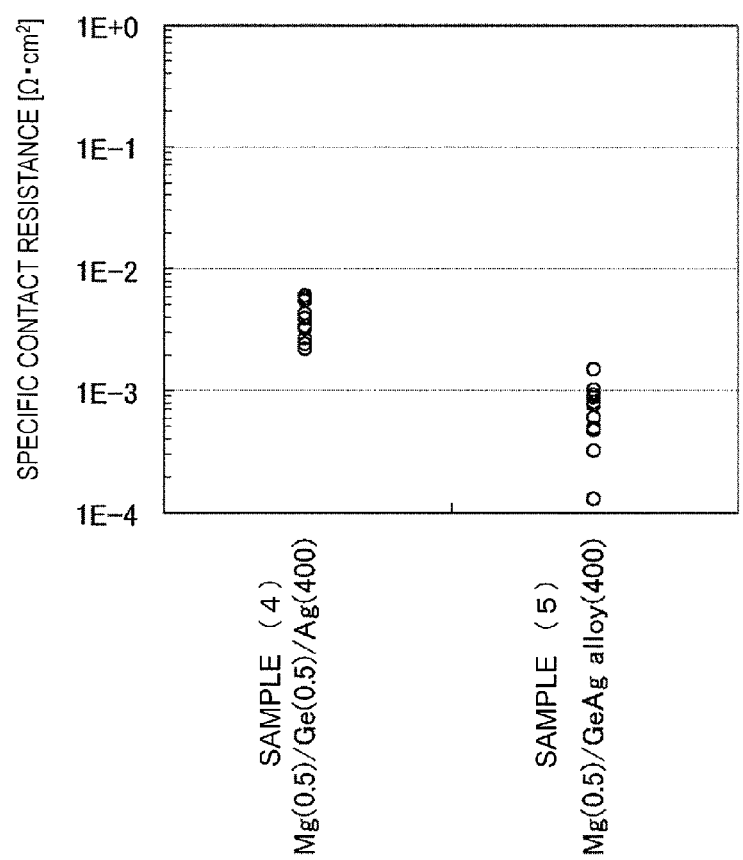
FIG. 11 shows the results of a TLM measurement that was carried out on an electrode that included Ag as its principal component and also included Mg and Ge and that had been formed on an m-plane p-type contact region.

FIG. 11 shows the results of a TLM measurement which was carried out on an electrode that included Ag as its principal component and also included Mg and Ge and that was formed on an m-plane p-type contact region.

Sample (4) was obtained by depositing an Mg layer to a thickness of 0.5 nm on the m-plane p-type contact region, depositing a Ge layer to a thickness of 0.5 nm thereon, and then depositing an Ag layer to a thickness of 400 nm thereon.

Sample (5) was obtained by depositing an Mg layer to a thickness of 0.5 nm on the m-plane p-type contact region and then depositing a Ge—Ag alloy layer to a thickness of 400 nm thereon. As an evaporation source to make the Ge—Ag alloy layer, a Ge—Ag alloy, of which the base material was Ag and which included 0.1 mass % of Ge, was used.

These Samples (4) and (5) were subjected to a heat treatment at a temperature of 500 degrees Celsius for 10 minutes in an atmosphere in which nitrogen and oxygen were mixed together at a ratio of ten to one.

Sample (4) had a contact resistance of $4.2 \times 10^{-3}$ $\Omega \cdot$cm in average, while Sample (5) had a contact resistance of $6.2 \times 10^{-4}$ $\Omega \cdot$cm$^2$ in average. These results reveal that Sample (5) could have even lower contact resistance than Sample (4).

As a result of a SIMS measurement that was carried out on Sample (4), a very low Ge peak was observed in a portion of the electrode near the interface with the semiconductor. Thus, in Sample (4), Ge would have been present at the interface to have an adverse effect on the contact characteristic. In Sample (5), on the other hand, the Ge concentration at the interface would have been lower than in Sample (4) and Sample (5) would have achieved a better contact characteristic than Sample (4).

Comparative Experiment 4

Figure 12A:
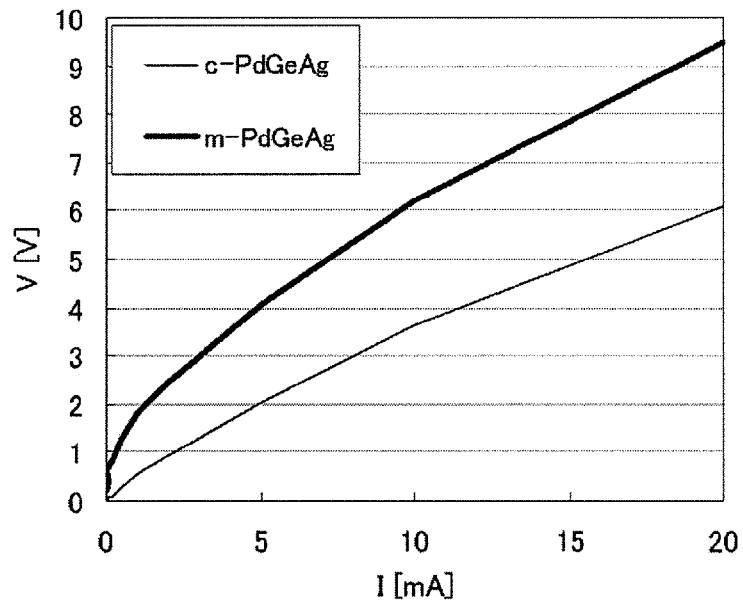
FIG. 12A is a graph showing the current-voltage characteristics that were obtained by carrying out a TLM measurement on (Pd, Ge) Ag electrodes that had been formed on a c-plane and an m-plane.
Figure 12B:
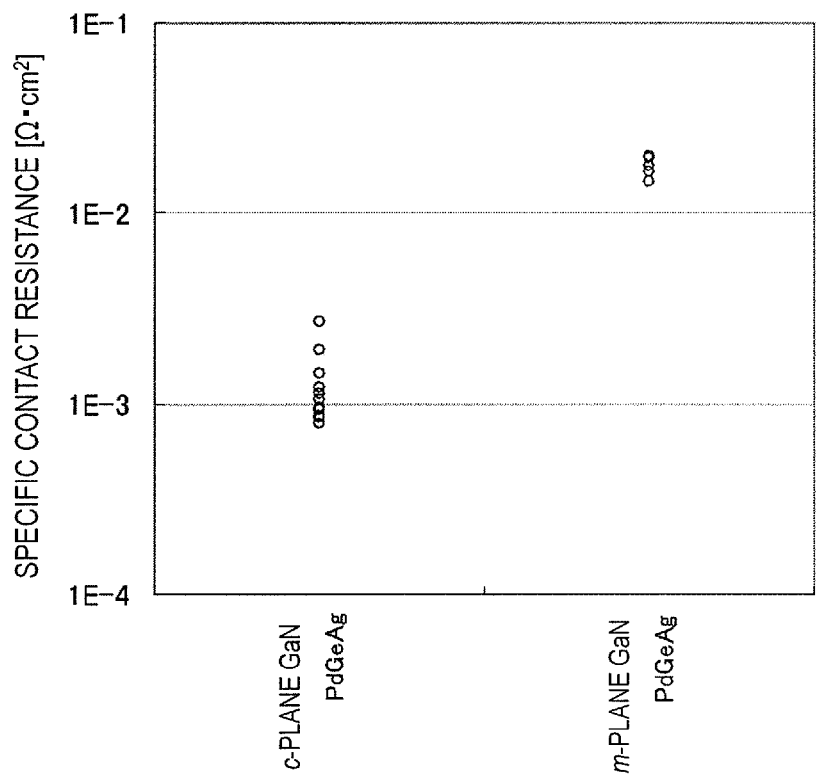
FIG. 12B is a graph showing the specific contact resistances that were calculated based on the results of the TLM measurement.

FIGS. 12A and 12B each show the results of TLM measurements which were carried out on an electrode that had been formed on c-plane GaN and on an electrode that had been formed on m-plane GaN. FIG. 12A shows the current-voltage characteristic between two electrodes that were spaced apart from each other by 8 μm. According to the results shown in FIG. 12A, the c-(Pd, Ge) Ag electrode exhibited an ohmic characteristic but the m-(Pd, Ge) Ag electrode had a high voltage and exhibited a Schottky characteristic. FIG. 12B is a graph showing the specific contact resistances calculated. The contact resistance of the m-(Pd, Ge) Ag electrode was approximately ten times as high as the contact resistance of the c-(Pd, Ge) Ag electrode. As can be seen, even electrodes that were made in the same way behaved differently depending on the plane orientation of their semiconductor growing plane.

Japanese Laid-Open Patent Publication No. 2010-56423 does disclose an Ag electrode including Pd and Ge but says nothing about the plane orientation of a semiconductor growing plane. Thus, it seems that Japanese Laid-Open Patent Publication No. 2010-56423 just discloses a technique about ordinary c-plane GaN. It is obvious from the results shown in FIG. 12 that it is not easy to apply the technique disclosed in Japanese Laid-Open Patent Publication No. 2010-56423 to the m-plane GaN.

As can be seen from the foregoing description, the electrode made by the method of this embodiment can achieve a low contact resistance and a high optical reflectance as an electrode 30 for a nitride-based semiconductor light-emitting element, of which the growing plane is an m-plane. As a result, a nitride-based semiconductor light-emitting element 100 that achieves high luminous efficiency is realized.

The light-emitting element of this embodiment could be used as it is as a light source. However, if the light-emitting element of this embodiment is combined with a resin including a phosphor that changes the wavelength, for example, the element of this embodiment can be used effectively as a light source having an expanded operating wavelength range (such as a white light source).

Comparative Experiment 5

Figure 13A:
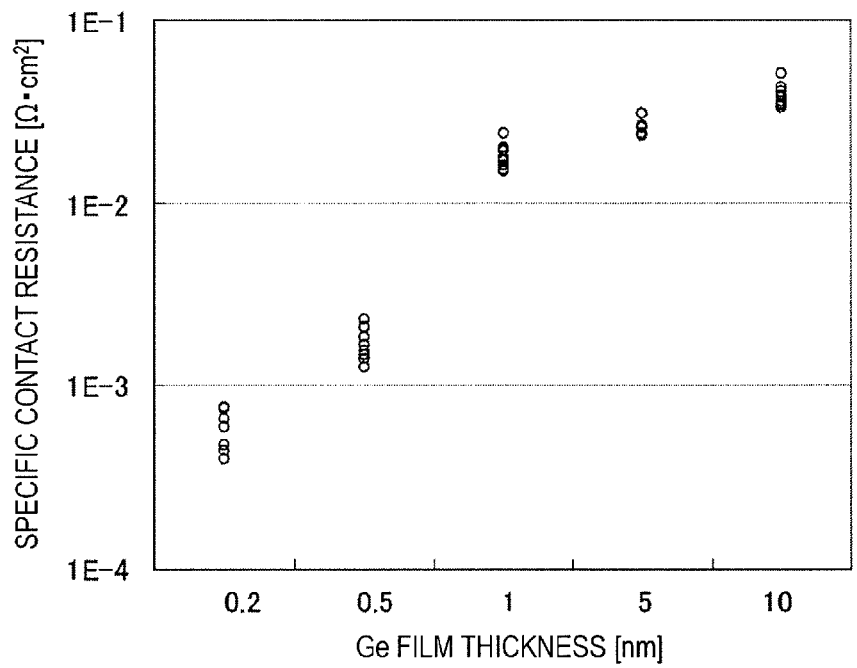
FIG. 13A is a graph showing how the contact resistance changed with the thickness of the Ge layer.

FIG. 13A is a graph showing how the contact resistance changed with the thickness of a Ge layer. The samples of measurement shown in FIG. 13A were obtained by depositing a Zn layer to a thickness of 0.5 nm, the Ge layer, and an Ag layer to a thickness of 400 nm in this order on a p-type contact region and then subjecting them to a heat treatment at a temperature of 500 degrees Celsius for 10 minutes.

When the Ge layer had thicknesses of 0.2 nm, 0.5 nm, 1.0 nm, 5 nm and 10 nm, the average contact resistances were $6.0 \times 10^{-4}$ $\Omega \cdot$cm$^2$, $1.9 \times 10^{-3}$ $\Omega \cdot$cm$^2$, $1.8 \times 10^{-2}$ $\Omega \cdot$cm$^2$, $3.8 \times 10^{-2}$ $\Omega \cdot$cm$^2$, and $3.9 \times 10^{-2}$ $\Omega \cdot$cm, respectively. Also, when the Ge layer had thicknesses of 0.2 nm, 0.5 nm, 1.0 nm, 5 nm and 10 nm, Ge respectively accounted for 0.025 mass %, 0.063 mass %, 0.12 mass %, 0.64 mass % and 1.25 mass % of the electrode.

As can be seen from these results, if the Ge layer had a thickness of 0.5 nm or less (i.e., if Ge accounted for 0.063 mass % or less of the electrode), the contact resistance obtained was as low as $1.9 \times 10^{-3}$ $\Omega \cdot cm^2$ or less.

Figure 13B:
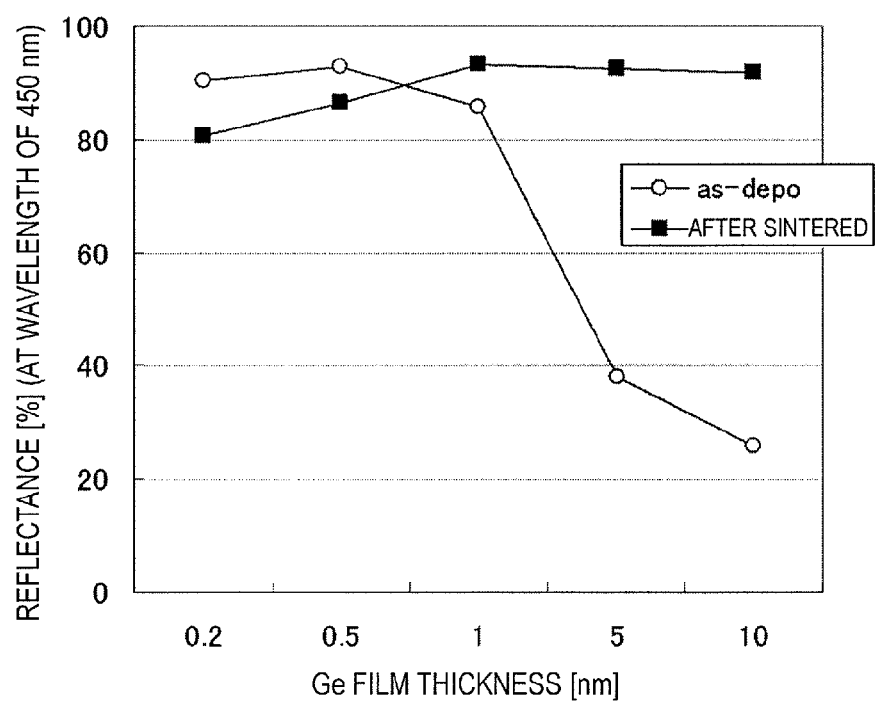
FIG. 13B is a graph showing how the optical reflectance changed with the thickness of the Ge layer.

FIG. 13B is a graph showing how the optical reflectance changed with the thickness of Ge. As the samples of measurement shown in FIG. 13B, the same samples as the ones shown in FIG. 13A were used. The reflectances were measured with the light that had come from over the GaN-based substrate made incident at an angle of incidence of 5 degrees. In FIG. 13B, shown are the reflectances of the samples in the "as-depo" state (i.e., after the respective layers forming the electrode had been deposited and before the electrode was subjected to a heat treatment) and in the thermally treated state. The following Table 2 shows the reflectances of the respective samples.

TABLE 2

| Ge thickness [nm] | 0.2 | 0.5 | 1 | 5 | 10 |
|---|---|---|---|---|---|
| Ge concentration [wt %] | 0.025 | 0.063 | 0.12 | 0.63 | 1.25 |
| as-depo | 90.4 | 92.7 | 85.8 | 38.1 | 25.7 |
| after sintered (after thermally treated) | 80.1 | 86.5 | 92.3 | 92.5 | 91.7 |

As can be seen from these results, after the heat treatment, a reflectance as high as 91% or more was achieved when the thickness of Ge was 1.0 nm or more (i.e., when Ge accounted for 0.12 mass % or more of the electrode).

Thus, it can be seen that Ge may account for 0.063 mass % or less to achieve an even lower contact resistance, and may account for 0.12 mass % or more to achieve an even higher reflectance.

Figure 14:
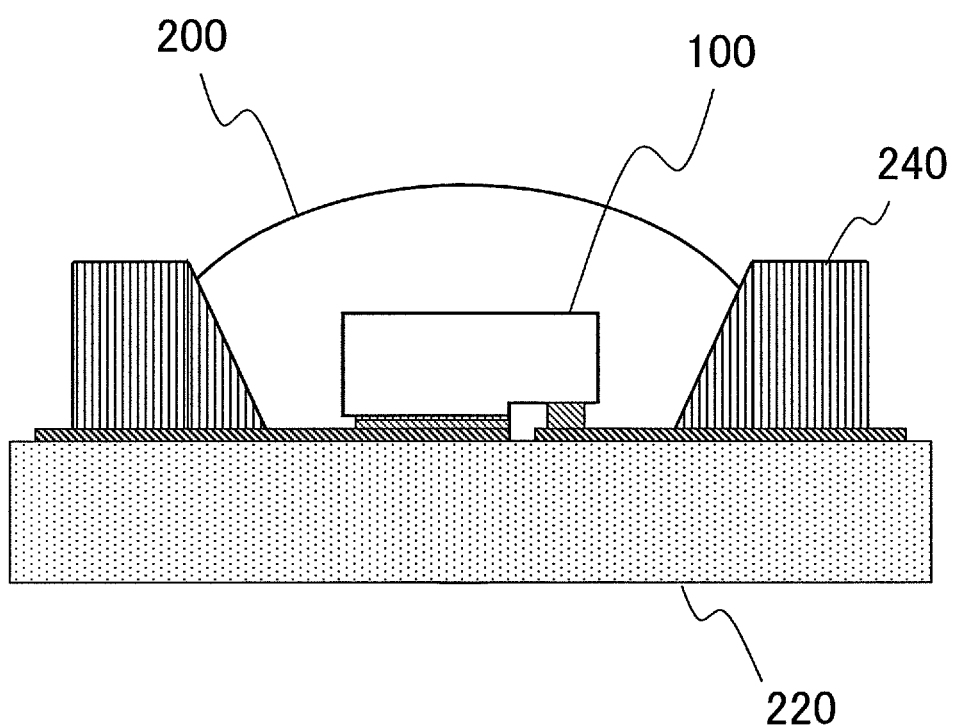
FIG. 14 is a schematic cross-sectional view illustrating a light source as an exemplary embodiment of the present disclosure.

FIG. 14 is a schematic representation illustrating an example of such a white light source. The light source shown in FIG. 14 includes a light-emitting element 100 having the structure shown in FIG. 3A and a resin layer 200 in which particles of a phosphor such as YAG (yttrium aluminum garnet) are dispersed to change the wavelength of the light emitted from the light-emitting element 100 into a longer one. The light-emitting element 100 is mounted on a supporting member 220 on which a wiring pattern has been formed. And on the supporting member 220, a reflective member 240 is arranged so as to surround the light-emitting element 100. The resin layer 200 has been formed so as to cover the light-emitting element 100.

In the embodiment described above, the p-type semiconductor region to contact with the electrode 30 is supposed to be formed of either GaN or AlGaN. However, the p-type semiconductor region could also be a layer including In such as InGaN. In that case, the contact layer to contact with the electrode 30 could be formed of $In_{0.2}Ga_{0.0}N$ with an In composition of 0.2, for example. If In is included in GaN, the bandgap of $Al_aGa_bN$ layer (where $a+b=1$, $a \geq 0$ and $b > 0$) can be smaller than that of GaN, and therefore, the contact resistance can be reduced as a result. Consequently, the p-type semiconductor region that contacts with the electrode 30 may be formed of an $Al_xIn_yGa_zN$ (where $x+y+z=1$, $x \geq 0$, $y > 0$ and $z \geq 0$) semiconductor.

While the present disclosure has been described with respect to exemplary embodiments thereof, this invention is in no way limited to those specific embodiments but could be modified in numerous ways and may assume many embodiments other than those specifically described above.

It should be noted that the growing plane of an actual m-plane semiconductor does not always have to be perfectly parallel to an m-plane but may define a predetermined tilt angle with respect to an m-plane. The tilt angle is defined by the angle that is formed between a normal line to the principal surface or growing plane of a nitride semiconductor layer and a normal line to the m-plane. The absolute value of the tilt angle θ may be 5 degrees or less, and is suitably 1 degree or less, in the c-axis direction, and may be 5 degrees or less, and is suitably 1 degree or less, in the a-axis direction, too. If the tilt angle falls within such a range, then the principal surface of the nitride semiconductor layer is tilted overall with respect to the m-plane. However, the principal surface should actually include a huge number of m-plane regions exposed, speaking microscopically. That is why planes that are tilted at an angle of 5 degrees or less (which is the absolute value) with respect to an m-plane would have similar properties to those of the m-plane. Also, if the absolute value of the tilt angle θ is set to be 5 degrees or less, a decrease in internal quantum efficiency to be caused by the piezoelectric field can be minimized. Consequently, according to the present disclosure, the "m-plane" includes planes, of which the absolute value of the tilt angle θ is 5 degrees or less in both of the c-axis and a-axis directions. Also, the "m-plane" according to the present disclosure include a plane having a plurality of stepped m-plane regions.

The effect of reducing the contact resistance can naturally be achieved by not only an LED but also any other kind of light-emitting element (such as a semiconductor laser diode) as well.

The light-emitting element of this embodiment is a GaN-based semiconductor light-emitting element such as a light-emitting diode or a laser diode that operates at wavelengths over the entire visible radiation range, which covers the ultraviolet, blue, green, orange and white parts of the spectrum.

A light-emitting element according to an aspect of the present disclosure can be used effectively in the fields of display, illumination and optical information processing.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A method for fabricating a nitride semiconductor light-emitting element, the method comprising the steps of:
   (a) providing a substrate;
   (b) forming a nitride-based semiconductor multilayer structure including an n-type semiconductor region, an active layer, and a p-type semiconductor region on the substrate, the nitride-based semiconductor multilayer structure having a growing plane which is an m-plane;
   (c) forming a p-side electrode on the growing plane of the p-type semiconductor region; and
   (d) heating the nitride-based semiconductor multilayer structure after the step (c) has been performed to diffuse Ge in the p-side electrode so that the concentration of Ge becomes lower at an interface between the p-side electrode and the p-type semiconductor region than at the surface of the p-side electrode opposite from the p-type semiconductor region.

2. The method of claim 1, wherein the step (c) includes the steps of depositing at least one of Zn and Mg layers on the growing plane of the p-type semiconductor region and depositing an Ag alloy layer including Ge.

3. The method of claim 1, wherein the step (c) includes the steps of depositing a Ge layer on the growing plane of the p-type semiconductor region and depositing a Zn layer or an Mg layer.

4. The method of claim 1, wherein the step (c) includes the step of depositing an Ag alloy layer including Ge and at least one of Zn and Mg.

5. The method of claim 1, wherein the step (d) includes the step of heating the electrode at a temperature of not less than 400 degrees Celsius and not more than 600 degrees Celsius.

6. The method of claim 1, wherein the step (c) includes forming the electrode so that elements other than Ag, Mg, Zn, Ge and Ga that are included in the electrode have a concentration of 0.1 mass % or less in total.

7. A nitride semiconductor light-emitting element comprising:
 an n-side electrode;
 a nitride-based semiconductor multilayer structure including an n-type semiconductor region, an active layer and a p-type semiconductor region, the nitride-based semiconductor multilayer structure having a growing plane which is an m-plane; and
 a p-side electrode which is arranged on the p-type semiconductor region,
 wherein the p-type semiconductor region is formed of a GaN-based semiconductor,
 the p-side electrode is formed of an alloy including Ag as the principal component and also including Ge and at least one of Mg and Zn,
 Ge has been diffused in the alloy, and
 the concentration of Ge is lower at an interface between the p-side electrode and the p-type semiconductor region than at the surface of the p-side electrode opposite from the p-type semiconductor region.

8. The nitride semiconductor light-emitting element of claim 7, wherein the p-side electrode includes Ag at a concentration of 50 mass % or more and also includes Mg, Zn and Ge at a concentration of 50 mass % or less in total.

9. The nitride semiconductor light-emitting element of claim 7, wherein the p-side electrode includes Ag at a concentration of 90 mass % or more and also includes Mg, Zn and Ge at a concentration of 10 mass % or less in total.

10. The nitride semiconductor light-emitting element of claim 7, wherein the p-side electrode includes Ge at a concentration of not less than 0.05 mass % and not more than 2.0 mass %.

11. The nitride semiconductor light-emitting element of claim 7, wherein at an interface between the p-side electrode and the p-type semiconductor region, either Mg or Zn has a higher concentration than Ge.

12. The nitride semiconductor light-emitting element of claim 7, wherein the p-side electrode includes Ga that has diffused from the p-type semiconductor region and the more distant from the interface with the p-type semiconductor region it is, the lower the concentration of Ga in the p-side electrode is.

13. The nitride semiconductor light-emitting element of claim 7, wherein the p-side electrode has a reflectance of 85% or more with respect to light having a wavelength of 450 nm.

14. The nitride semiconductor light-emitting element of claim 7, wherein the p-side electrode has a reflectance of 90% or more with respect to light having a wavelength of 520 nm.

15. The nitride semiconductor light-emitting element of claim 7, wherein the p-side electrode has a thickness of not less than 2 nm and not more than 500 nm.

16. The nitride semiconductor light-emitting element of claim 7, wherein the p-type semiconductor region is formed of an $Al_xGa_yIn_zN$, where $x+y+z=1$, $x\geq 0$, $y>0$ and $z\geq 0$, semiconductor.

17. A light source comprising:
 the nitride semiconductor light-emitting element of claim 7; and
 a wavelength changing portion which includes a phosphor that changes the wavelength of light that has been emitted from the nitride semiconductor light-emitting element.

18. The nitride semiconductor light-emitting element of claim 7, wherein the p-side electrode includes elements other than Ag, Mg, Zn, Ge and Ga at a concentration of 0.1 mass % or less in total.

19. The nitride semiconductor light-emitting element of claim 18, wherein the elements include at least one element selected from the group consisting of Ni, Cu, Pd, In, Sn, Nd, Sm, Pt, Au and Bi.

* * * * *